(12) United States Patent
Hieda et al.

(10) Patent No.: US 10,580,911 B2
(45) Date of Patent: Mar. 3, 2020

(54) PHOTOVOLTAIC ELEMENT

(71) Applicant: SHARP KABUSHIKI KAISHA, Sakai, Osaka (JP)

(72) Inventors: Takeshi Hieda, Sakai (JP); Masamichi Kobayashi, Sakai (JP); Chikao Okamoto, Sakai (JP); Yuta Matsumoto, Sakai (JP); Kenji Kimoto, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/753,120

(22) PCT Filed: Aug. 21, 2015

(86) PCT No.: PCT/JP2015/073569
§ 371 (c)(1),
(2) Date: Feb. 15, 2018

(87) PCT Pub. No.: WO2017/033232
PCT Pub. Date: Mar. 2, 2017

(65) Prior Publication Data
US 2018/0248056 A1 Aug. 30, 2018

(51) Int. Cl.
*H01L 31/0224* (2006.01)
*H01L 31/072* (2012.01)
*H01L 31/075* (2012.01)

(52) U.S. Cl.
CPC .... *H01L 31/022441* (2013.01); *H01L 31/072* (2013.01); *H01L 31/075* (2013.01)

(58) Field of Classification Search
CPC ..... H01L 31/022441; H01L 31/022426; H01L 31/022433
See application file for complete search history.

(56) References Cited

U.S. PATENT DOCUMENTS

| 2005/0150543 | A1* | 7/2005 | Nakashima ..... H01L 31/022425 136/256 |
| 2010/0314657 | A1 | 12/2010 | Hsieh et al. |
| 2015/0221791 | A1 | 8/2015 | Harada et al. |
| 2015/0221801 | A1 | 8/2015 | Yamamoto et al. |
| 2015/0228822 | A1* | 8/2015 | Fujishima ......... H01L 31/02167 136/256 |

FOREIGN PATENT DOCUMENTS

| CN | 101604708 A | 12/2009 |
| CN | 101931034 A | 12/2010 |
| CN | 104685639 A | 6/2015 |
| JP | 2010-080887 A | 4/2010 |
| JP | 2013-187287 A | 9/2013 |
| JP | 2015-053302 A | 3/2015 |

* cited by examiner

*Primary Examiner* — Daniel P Malley, Jr.
(74) *Attorney, Agent, or Firm* — ScienBiziP, P.C.

(57) ABSTRACT

A photovoltaic element includes: a semiconductor substrate; a first i-type semiconductor film provided on a part of one of surfaces of the semiconductor substrate; a first semiconductor region including a first-conductivity-type semiconductor film provided on the first i-type semiconductor film; a first electrode layer provided on the first semiconductor region; a first conductive film interposed at least at a site between the first semiconductor region and the first electrode layer.

6 Claims, 12 Drawing Sheets

//PHOTOVOLTAIC ELEMENT

TECHNICAL FIELD

The present invention relates to photovoltaic elements.

BACKGROUND ART

Solar cells are capable of directly converting solar energy to electric energy and increasingly expected as a next-generation energy source, particularly in view of global environmental problems. They come in many varieties including those based on compound semiconductors and organic materials. Silicon crystal-based solar cells are currently popular.

Solar cells can be classified into two categories: those having electrodes both on a light-receiving face through which sunlight enters the solar cell and on a face opposite the light-receiving face (i.e., back face) ("double-side-electrode structure") and those having electrodes only on the back face ("backside-electrode structure"). The solar cell with a backside-electrode structure has an advantage that the quantity of incoming sunlight increases due to the absence of electrodes on the light-receiving face.

Patent Literature 1, as an example, describes a solar cell with a backside-electrode structure. The solar cell of Patent Literature 1 includes a semiconductor substrate with a back face having i-n junctions and i-p junctions formed thereon, with n-type electrodes on the i-n junctions and p-type electrodes on the i-p junctions. In this solar cell, as sunlight enters the semiconductor substrate through the light-receiving face thereof, carriers are generated in the semiconductor substrate and collected and extracted through the p- and n-type electrodes.

CITATION LIST

Patent Literature

Patent Literature 1: Japanese Unexamined Patent Application Publication, Tokukai, No. 2010-80887

SUMMARY OF INVENTION

Technical Problem

Improvement of properties and reliability is still being sought and pursued in the technical field of solar cells and other like photovoltaic elements.

In view of such a situation, it is an object of the present invention to provide a photovoltaic element with improved properties and reliability and a method of manufacturing such a photovoltaic element.

Solution to Problem

The present invention, in a first aspect thereof, provides a photovoltaic element including: a semiconductor substrate; a first i-type semiconductor film on a part of one of surfaces of the semiconductor substrate; a first semiconductor region including a first-conductivity-type semiconductor film on the first i-type semiconductor film; a first electrode layer on the first semiconductor region; a second i-type semiconductor film another part of that surface of the semiconductor substrate; a second semiconductor region including a second-conductivity-type semiconductor film on the second i-type semiconductor film; a second electrode layer on the second semiconductor region; and a first conductive film interposed at least at a site between the first semiconductor region and the first electrode layer.

The present invention, in a second aspect thereof, provides a photovoltaic element including: a semiconductor substrate; a first semiconductor region including a first-conductivity-type purity diffusion region below a part of one of surfaces of the semiconductor substrate; a first electrode layer on the first semiconductor region; a second semiconductor region including a second-conductivity-type impurity diffusion region below another part of that surface of the semiconductor substrate; a second electrode layer on the second semiconductor region; and a first conductive film interposed at least at a site between the first semiconductor region and the first electrode layer.

The present invention, in a third aspect thereof, provides a photovoltaic element including: a semiconductor substrate; a first semiconductor region including a first-conductivity-type semiconductor film on one of surfaces of the semiconductor substrate; a first electrode layer on the first semiconductor region; a second semiconductor region including a second-conductivity-type semiconductor film on a light-receiving face that is another one of the surfaces of the semiconductor substrate; a second electrode layer on the second semiconductor region; and a first conductive film interposed at least at a site between the first semiconductor region and the first electrode layer.

Advantageous Effects of Invention

The present invention provides a photovoltaic element with improved properties and reliability over conventional photovoltaic elements.

DESCRIPTION OF EMBODIMENTS

Figure 1:
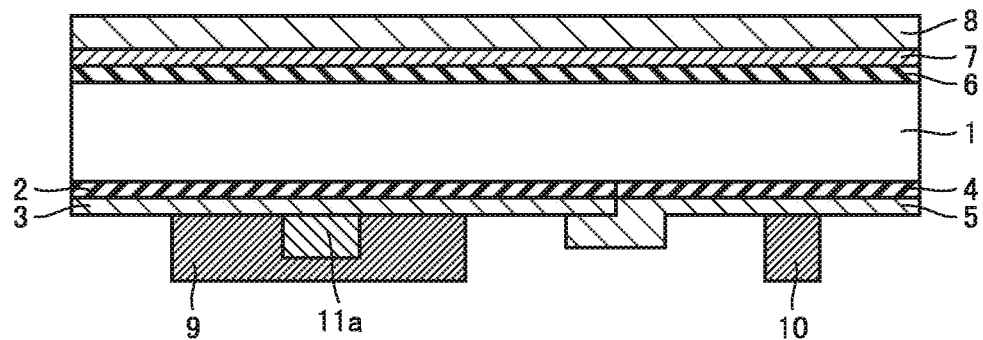
FIG. 1 is a schematic cross-sectional view of a heterojunction back-contact cell in accordance with Embodiment 1.

The following will describe embodiments that are examples of the present invention. In the drawings used in the description of the embodiments, the same reference numerals indicate either the same or equivalent members.

Embodiment 1

Structure of Photovoltaic Element

FIG. 1 is a schematic cross-sectional view of a heterojunction back-contact cell in accordance with Embodiment 1, which is an example of the photovoltaic element of the present invention.

The heterojunction back-contact cell of Embodiment 1 includes: a semiconductor substrate 1 composed of an n-type monocrystal silicon substrate; a first i-type semiconductor film 2 provided on a part of one of the surfaces (back face) of the semiconductor substrate 1; a first-conductivity-type semiconductor film 3 (first semiconductor region) composed of a p-type amorphous silicon film provided on the first i-type semiconductor film 2; a first conductive film 11a provided on the first-conductivity-type semiconductor film 3; and a first electrode layer 9 provided over the first conductive film 11a.

The heterojunction back-contact cell of Embodiment 1 further includes: a second i-type semiconductor film 4 provided on another part of the back face of the semiconductor substrate 1; a first second-conductivity-type semiconductor film 5 (second semiconductor region) composed of an n-type amorphous silicon film provided on the second i-type semiconductor film 4; and a second electrode layer 10 provided on the first second-conductivity-type semiconductor film 5.

The heterojunction back-contact cell of Embodiment 1 further includes: a third i-type semiconductor film 6 provided on the other surface (light-receiving face of the semiconductor substrate 1; a second second-conductivity-type semiconductor film 7 provided on the third i-type semiconductor film 6; and an antireflective film 8 provided on the second second-conductivity-type semiconductor film 7.

As shown in FIG. 1, the first electrode layer 9 is extended along the surface of the first conductive film 11a interposed at a site between the first-conductivity-type semiconductor film 3 and the first electrode layer 9 until the first electrode layer 9 reaches the surface of the first-conductivity-type semiconductor film 3. Specifically, the first electrode layer 9 is in direct contact with both the first-conductivity-type semiconductor film 3 and the first conductive film 11a, and the first conductive film 11a is in direct contact with both the first-conductivity-type semiconductor film 3 and the first electrode layer 9.

The semiconductor substrate 1 is preferably, but by no means limited to, an n-type monocrystal silicon substrate and may be, as an example, a conventionally known semiconductor substrate. The semiconductor substrate 1 is not particularly limited in thickness and may have a thickness of, for example, from 50 μm to 300 μm, inclusive, and preferably from 100 μm to 200 μm, inclusive. The semiconductor substrate 1 is not particularly limited in specific resistance and may have a specific resistance of, for example, from 0.1 Ω·cm to 10 Ω·cm, inclusive. The n-type impurity may have a concentration of, for example, from $1\times10^{18}$ atoms/cm$^3$ to $1\times10^{20}$ atoms/cm$^3$, inclusive. It will be appreciated that the semiconductor substrate 1 has a higher impurity concentration than an i-type semiconductor film.

The first i-type semiconductor film 2 is preferably, but by no means limited to, an i-type amorphous silicon film and may be, as an example, a conventionally known i-type semiconductor film. The first i-type semiconductor film 2 is not particularly limited in thickness and may have a thickness of, for example, from 1 nm to 50 nm, inclusive.

Note that throughout his description, the "i-type semiconductor" does not only refer to a completely intrinsic semiconductor, but also encompasses semiconductors contaminated with an n- or p-type impurity of sufficiently low concentration (both the n-type impurity concentration and the p-type impurity concentration are lower than $1\times10^{19}$ atoms/cm$^3$). The n- and p-type impurity concentrations can be measured by secondary ion mass spectrometry (SIMS).

Note also that "amorphous silicon," throughout this description, does not only refer to amorphous silicon containing silicon atoms with a dangling bond (i.e., an unhydrogenated end), but also encompasses hydrogenated amorphous silicon and other like silicon containing no atoms with a dangling bond.

The first-conductivity-type semiconductor film 3 is preferably, but by no means limited to, a p-type amorphous silicon film and may be, as an example, a conventional known p-type semiconductor film. The first-conductivity-type semiconductor film 3 may contain, for example, boron as a p-type impurity. The p-type impurity may have a concentration of, for example, approximately $5\times10^{19}$ atoms/cm$^3$. The first-conductivity-type semiconductor film 3 is not particularly limited in thickness and may have a thickness of, for example, from 5 nm to 50 nm, inclusive.

The second i-type semiconductor film 4 is preferably, but by no means limited to, an i-type amorphous silicon film and may be, as an example, a conventionally known i-type semiconductor film. The second i-type semiconductor film 4 is not particularly limited in thickness and may have a thickness of, for example, from 1 nm to 50 nm, inclusive.

The first second-conductivity-type semiconductor film 5 is preferably, but by no means limited to, an n-type amorphous silicon film and may be, as an example, a conventionally known n-type semiconductor film. The first second-conductivity-type semiconductor film 5 may contain, for example, phosphorus as an n-type impurity. The first second-conductivity-type semiconductor film 5 is not particularly limited in thickness and may have a thickness of, for example, from 5 nm to 50 nm, inclusive.

The third i-type semiconductor film 6 is preferably, but by no means limited to, an i-type amorphous silicon film and may be, as an example, a conventionally known i-type semiconductor film. The third i-type semiconductor film 6 is not particularly limited in thickness and may have a thickness of, for example, from 1 nm to 50 nm, inclusive.

The second second-conductivity-type semiconductor film 7 is preferably, but by no means limited to, an n-type amorphous silicon film and may be, as an example, a conventionally known n-type semiconductor film. The second second-conductivity-type semiconductor film 7 may contain, for example, phosphorus as an n-type impurity. The n-type impurity may have a concentration of, for example, approximately $5\times10^{19}$ atoms/cm$^3$. The second second-conductivity-type semiconductor film 7 is not particularly limited in thickness and may have a thickness of, for example, from 5 nm to 50 nm, inclusive.

The antireflective film 8 may be, as an example, either an oxide layer or a nitride layer or a combination of both. The oxide layer may be, as an example, a silicon oxide layer. The nitride layer may be, as an example, a silicon nitride layer. Therefore, the antireflective film 8 may be, as an example, a silicon oxide monolayer, a silicon nitride monolayer, or a laminate of silicon oxide and silicon nitride layers. The antireflective film 8 may have a thickness of, for example, from 40 nm to 800 nm, inclusive.

The first electrode layer 9 and the second electrode layer 10 may be made of any conductive material with no particular limitation and are preferably made of either aluminum or silver or a combination of both. The first electrode layer 9 needs to be thicker than the first conductive film 11a and may have a thickness of, for example, less than or equal to 0.5 μm. The second electrode layer 10 is not particularly limited in thickness and may have a thickness of, for example, less than or equal to 0.5 μm.

The first conductive film 11a may be any conductive film that exhibits high adherence to the first-conductivity-type semiconductor film 3 and the first electrode layer 9. Examples include ITO (indium tin oxide), ZnO (zinc oxide), SnO (tin oxide), IWO (tungsten-doped indium oxide), and FTO (fluorine-doped tin oxide). The first conductive film 11a is preferably thinner than the first electrode layer 9, more preferably has a thickness less than or equal to half that of the first electrode layer 9, and even more preferably has a thickness of less than or equal to 20 nm.

Method of Manufacturing Photovoltaic Element

Figure 2:
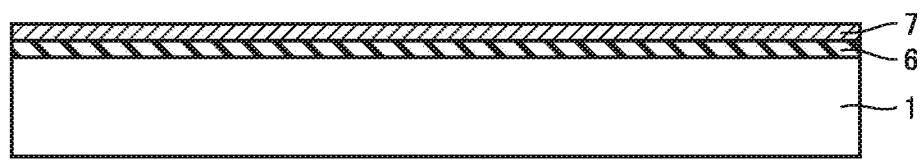
FIG. 2 is a schematic cross-sectional view showing an exemplary method of manufacturing a heterojunction back-contact cell in accordance with Embodiment 1.

The following will describe an exemplary method of manufacturing a heterojunction back-contact cell in accordance with Embodiment 1 in reference to the schematic cross-sectional views in FIGS. 2 to 17. First, referring to FIG. 2, the third i-type semiconductor film 6 is formed on the entire light-receiving face of the semiconductor substrate 1, and the second second-conductivity-type semiconductor film 7 is formed on the entire light-receiving face of the third i-type semiconductor film 6.

The third i-type semiconductor film 6 and the second second-conductivity-type semiconductor film 7 may be formed by any method, including plasma CVD (chemical vapor deposition).

Before forming the third i-type semiconductor film 6 on the tight-receiving face of the semiconductor substrate 1, the light-receiving face of the semiconductor substrate 1 may be processed to have irregularities thereon. These irregularities can be formed by, for example, forming a texturing mask on the entire back face of the semiconductor substrate 1 and then texture-etching the light-receiving face of the semiconductor substrate 1. The texturing mask may be made of, for example, silicon nitride or silicon oxide. The etchant used in the texture etching may be, for example, an alkaline solution that dissolves silicon.

Figure 3:
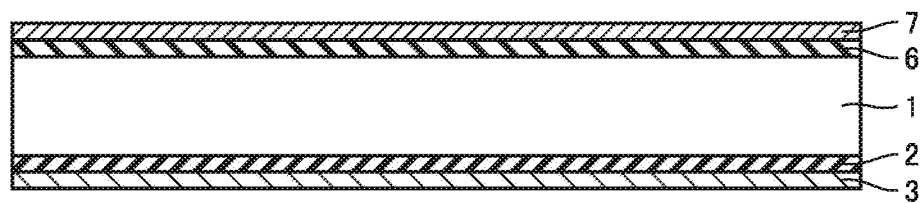
FIG. 3 is a schematic cross-sectional view showing an exemplary method of manufacturing a heterojunction back-contact cell in accordance with Embodiment 1.

Next, referring to FIG. 3, the first i-type semiconductor film 2 is formed on the entire back face of the semiconductor substrate 1, and the first-conductivity-type semiconductor film 3 is formed on the first i-type semiconductor film 2. The first i-type semiconductor film 2 and the first-conductivity-type semiconductor film 3 may be formed by any method, including plasma CVD.

Figure 4:
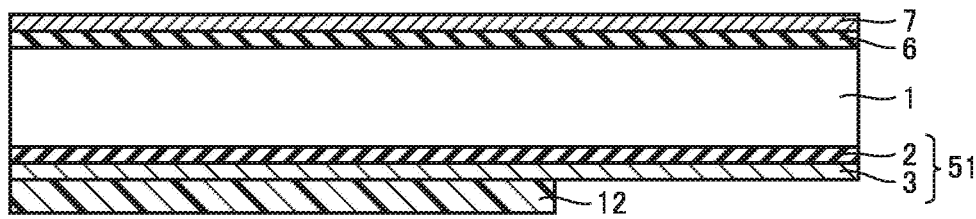
FIG. 4 is a schematic cross-sectional view showing an exemplary method of manufacturing a heterojunction back-contact cell in accordance with Embodiment 1.

Next, referring to FIG. 4, an etching mask 12 is formed of, for example, photoresist only on those portions of the back face of the semiconductor substrate 1 where there should be left unetched a laminate 51 of the first i-type semiconductor film 2 and the first-conductivity-type semiconductor film 3.

Figure 5:
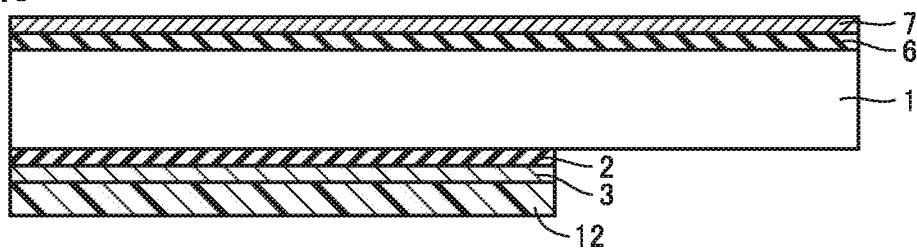
FIG. 5 is a schematic cross-sectional view showing an exemplary method of manufacturing a heterojunction back-contact cell in accordance with Embodiment 1.

Next, referring to FIG. 5, the laminate 51 of the first i-type semiconductor film 2 and the first-conductivity-type semiconductor film 3 is partly etched out in the thickness direction using the etching mask 12 as a mask. This step exposes the surface of the semiconductor substrate 1. As an alternative to the etching in which the etching mask 12 is used as a mask, the laminate 51 may be partly removed, for example, by laser radiation.

Figure 6:
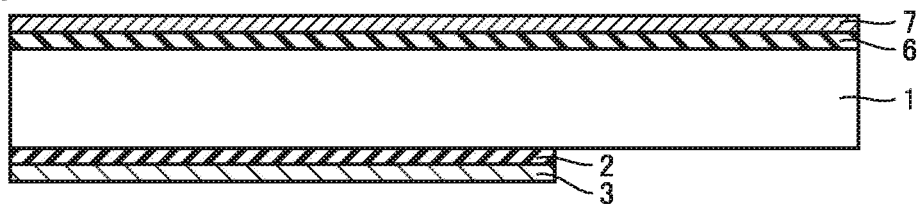
FIG. 6 is a schematic cross-sectional view showing an exemplary method of manufacturing a heterojunction back-contact cell in accordance with Embodiment 1.

Next, referring to FIG. 6, the etching mask 12 is completely removed from the first-conductivity-type semiconductor film 3.

Figure 7:
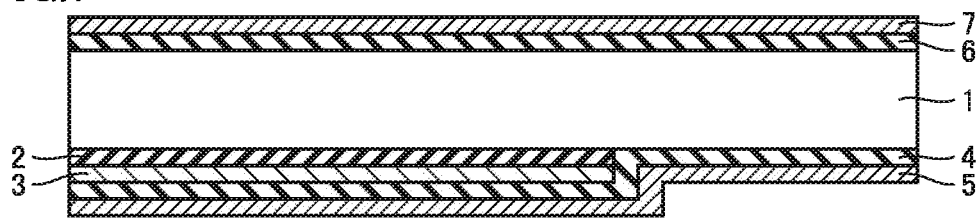
FIG. 7 is a schematic cross-sectional view showing an exemplary method of manufacturing a heterojunction back-contact cell in accordance with Embodiment 1.

Next, referring to FIG. 7, the second i-type semiconductor film 4 is formed in such a manner as to cover the exposed areas of the back face of the semiconductor substrate 1. The first second-conductivity-type semiconductor film 5 is then formed on the second i-type semiconductor film 4. The second i-type semiconductor film 4 and the first second-conductivity-type semiconductor film 5 may be formed by any method, including plasma CVD.

Figure 8:
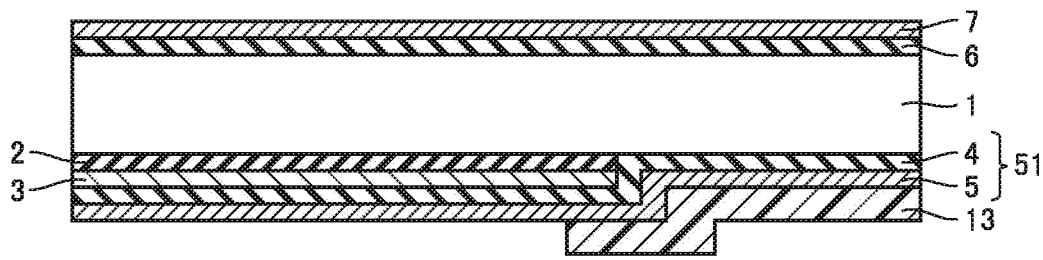
FIG. 8 is a schematic cross-sectional view showing an exemplary method of manufacturing a heterojunction back-contact cell in accordance with Embodiment 1.

Next, referring to FIG. 8, an etching mask 13 is formed of, for example, photoresist only on those portions of the back face of the semiconductor substrate 1 where there should be left unetched a laminate 52 of the second i-type semiconductor film 4 and the first second-conductivity-type semiconductor film 5.

Figure 9:
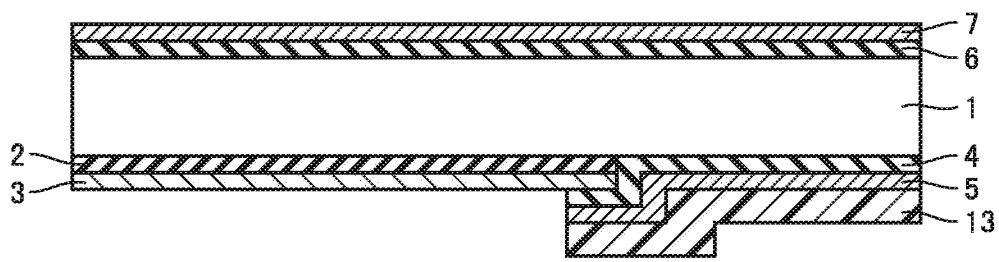
FIG. 9 is a schematic cross-sectional view showing an exemplary method of manufacturing a heterojunction back-contact cell in accordance with Embodiment 1.

Next, referring to FIG. 9, the laminate 52 of the second i-type semiconductor film 4 and the first second-conductivity-type semiconductor film 5 is partly etched out in the thickness direction using the etching mask 13 as a mask. This step exposes portions of the first-conductivity-type semiconductor film 3.

Figure 10:
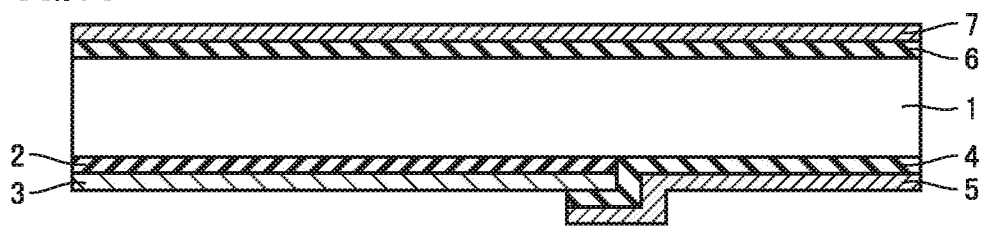
FIG. 10 is a schematic cross-sectional view showing an exemplary method of manufacturing a heterojunction back-contact cell in accordance with Embodiment 1.

Next, referring to FIG. 10, the etching mask 13 is completely removed from the first second-conductivity-type semiconductor film 5.

Figure 11:
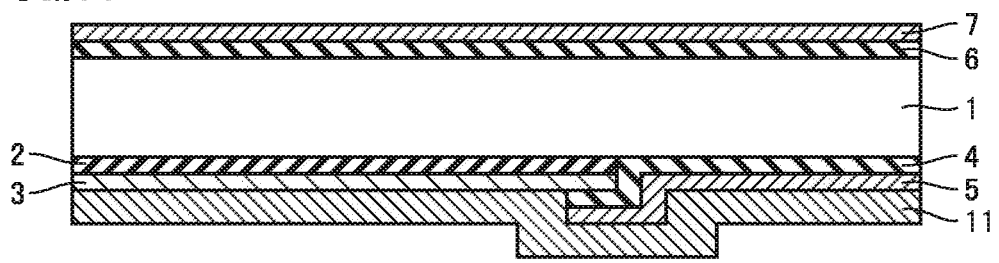
FIG. 11 is a schematic cross-sectional view showing an exemplary method of manufacturing a heterojunction back-contact cell in accordance with Embodiment 1.

Next, referring to FIG. 11, a conductive film 11 is formed to cover the entire back faces of the first-conductivity-type semiconductor film 3 and the first second-conductivity-type semiconductor film 5. The conductive film 11 may be formed by any method, including sputtering.

The conductive film 11 is a precursor of the conductive film 11a and for this reason may be made of any conductive material that exhibits high adherence to the first-conductivity-type semiconductor film 3 and the first electrode layer 9. Examples include ITO (indium tin oxide), ZnO (zinc oxide), SnO (tin oxide), IWO (tungsten-doped indium oxide), and FTO (fluorine-doped tin oxide). The conductive film 11 is preferably thinner than the first electrode layer 9 and more preferably has a thickness less than or equal to half that of the first electrode layer 9.

Figure 12:
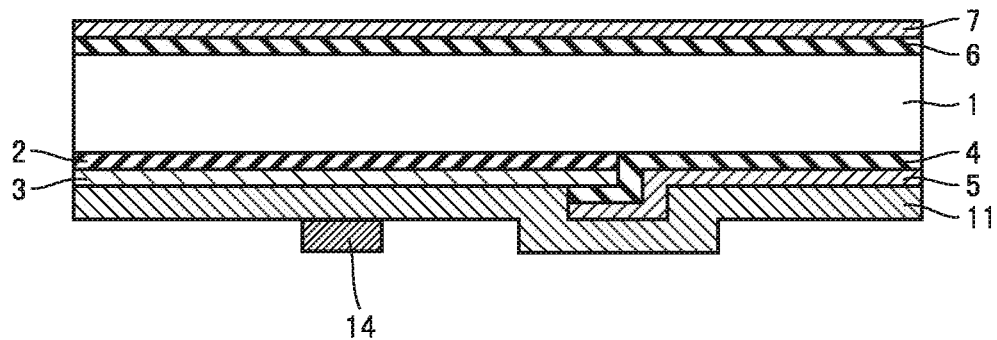
FIG. 12 is a schematic cross-sectional view showing an exemplary method of manufacturing a heterojunction back-contact cell in accordance with Embodiment 1.

Next, referring to FIG. 12, an etching mask 14 is formed of, for example, photoresist only on those portions of the conductive film 11 where there should be left the first conductive film 11a.

Figure 13:
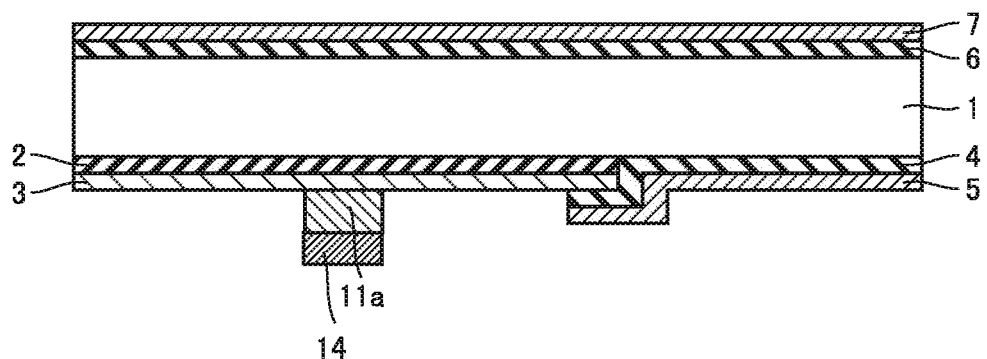
FIG. 13 is a schematic cross-sectional view showing an exemplary method of manufacturing a heterojunction back-contact cell in accordance with Embodiment 1.

Next, referring to FIG. 13, the conductive film 11 is removed using the etching mask 14 as a mask. This step exposes portions of the surface of the first-conductivity-type semiconductor film 3 and the entire surface of the first second-conductivity-type semiconductor film 5. The conductive film 11 may be removed by any method, including etching such as wet etching and dry etching. As an alternative to etching, the conductive film 11 may be removed by laser radiation.

Figure 14:
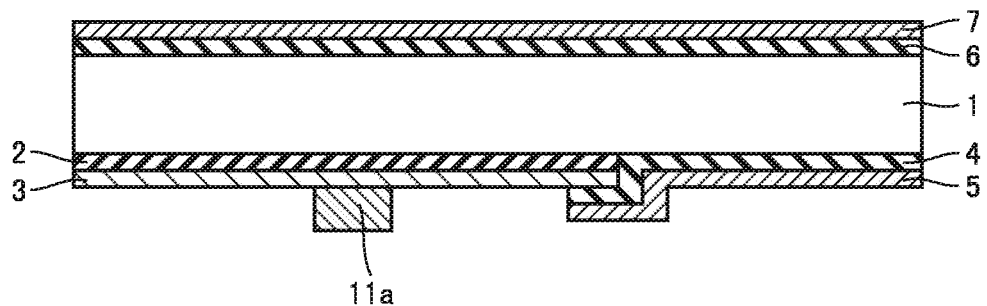
FIG. 14 is a schematic cross-sectional view showing an exemplary method of manufacturing a heterojunction back-contact cell in accordance with Embodiment 1.

Next, referring to FIG. 14, the etching mask 14 is removed, which forms the first conductive film 11a.

Figure 15:
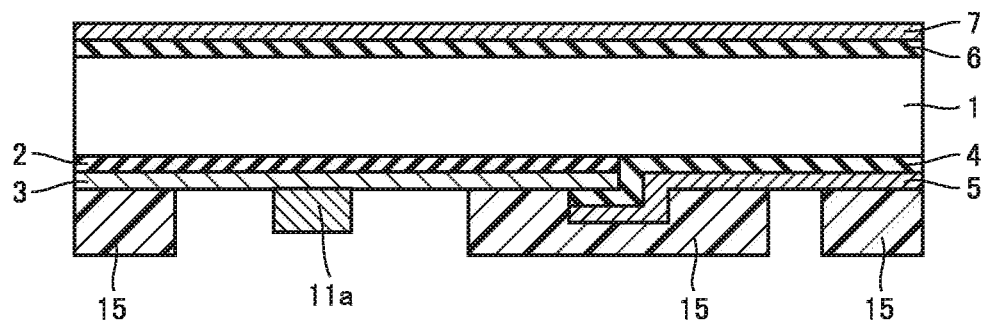
FIG. 15 is a schematic cross-sectional view showing an exemplary method of manufacturing a heterojunction hack-contact cell in accordance with Embodiment 1.

Next, referring to FIG. 15, an etching mask 15 made of, for example, photoresist is placed on some areas of the surfaces of the first-conductivity-type semiconductor film 3 and the first second-conductivity-type semiconductor film 5. The etching mask 15 has openings where the first electrode layer 9 and the second electrode layer 10 are to be formed.

Figure 16:
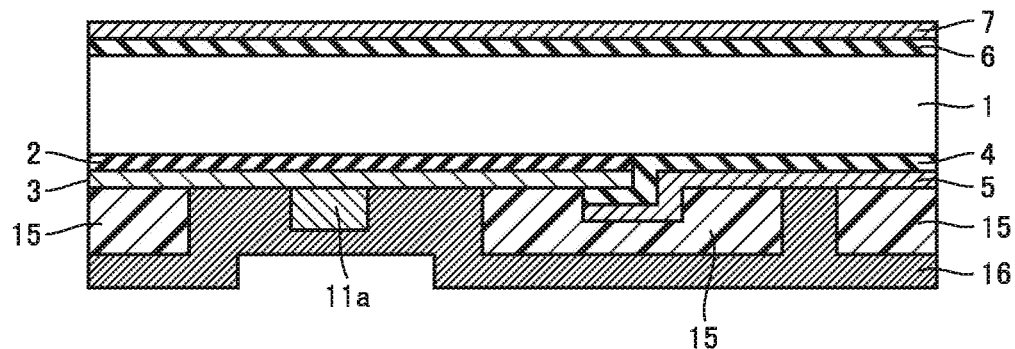
FIG. 16 is a schematic cross-sectional view showing an exemplary method of manufacturing a heterojunction hack-contact cell in accordance with Embodiment 1.

Next, referring to FIG. 16, an electrode layer 16 is deposited by, for example, sputtering or vapor deposition on the surface of the etching mask 15 and also on those parts of the first-conductivity-type semiconductor film 3, the first conductive film 11a, and the first second-conductivity-type semiconductor film 5 which are not covered by the etching mask 15.

The electrode layer 16 is a precursor of the first electrode layer 9 and the second electrode layer 10 and for this reason may be made of any conductive material with no particular limitation. It is especially preferable to use either aluminum or silver or a combination of both. The electrode layer 16 may have any thickness and is formed at least thicker than the first conductive film 11a.

Figure 17:
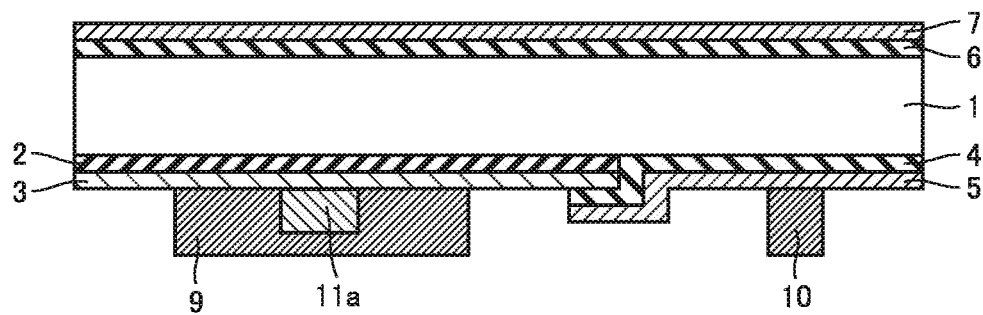
FIG. 17 is a schematic cross-sectional view showing an exemplary method of manufacturing a heterojunction back-contact cell in accordance with Embodiment 1.

Next, referring to FIG. 17, the etching mask 15, together with the electrode layer 16 thereon, is removed, which forms the first electrode layer 9 on the first-conductivity-type semiconductor film 3 and the second electrode layer 10 on the first second-conductivity-type semiconductor film 5. As an alternative to the etching in which the etching mask 15 is used, the first electrode layer 9 and the second electrode layer 10 may be formed, for example, by laser radiation.

Thereafter, as shown in FIG. 1, the antireflective film 8 is formed on the light-receiving face of the second second-conductivity-type semiconductor film 7. The antireflective film 8 may be formed by any method, including steam oxidation, normal pressure CVD, SOG coating and baking, plasma CVD, and normal pressure CVD. Specifically, a silicon oxide layer can be readily formed by, for example, steam oxidation, normal pressure CVD, or SOG coating and baking. A silicon nitride layer can be readily formed by, for example, plasma CVD or normal pressure CVD.

Hence, a heterojunction back-contact cell is provided in accordance with Embodiment 1 as shown in FIG. 1.

Functions and Effects

In Embodiment 1, the first conductive film 11a is provided on the first-conductivity-type semiconductor film 3 (first semiconductor region). The first electrode layer 9, provided over the first conductive film 11a, is extended along the surface of the first conductive film 11a until the first electrode layer 9 reaches the surface of the first-conductivity-type semiconductor film 3. This structure improves the properties and reliability of the heterojunction back-contact cell of Embodiment 1, which will be described here by comparing it with other structures.

If the silicon semiconductor of a heterojunction back-contact cell is in direct contact with electrodes across their entire interface with no intervening member therebetween as disclosed in Patent Literature 1, the electrodes could come off relatively easily because adherence is relatively low between metal electrodes and silicon crystals as in the silicon semiconductor in general.

Meanwhile, if an additional member is interposed across the entire interface of the electrodes and the silicon semiconductor to improve adherence and thereby prevent the electrodes from coming off, the electrodes will have a greater contact resistance than if no such additional member is interposed.

In contrast, if a conductive film that exhibits superb adherence both to the material for the silicon semiconductor and to the material for the electrodes is interposed at a site between the electrodes and the silicon semiconductor as shown in FIG. 1, the electrodes are prevented from undesirably coming off, and the contact resistance is also lowered.

More specifically, the problem of low adherence between the first electrode layer 9 (electrodes) and the first-conductivity-type semiconductor film 3 (silicon semiconductor) is remedied by interposing, between the first electrode layer 9 and the first-conductivity-type semiconductor film 3, the first conductive film 11a which exhibits superb adherence to the first electrode layer 9 and the first-conductivity-type semiconductor film 3. In addition, by interposing the first conductive film 11a at a site between the first electrode layer 9 and the first-conductivity-type semiconductor film 3 so that the first electrode layer 9 is partly in direct contact with the first-conductivity-type semiconductor film 3, the contact resistance, which will increase if an additional member is interposed across the entire interface, can be prevented from increasing. Thus, the heterojunction back-contact cell of Embodiment 1 improves the properties and reliability of the photovoltaic element.

To lower the contact resistance, the sheet resistance of the first conductive film 11a is preferably lower than the sheet resistance of the first-conductivity-type semiconductor film 3, more preferably lower than or equal to 500 M$\Omega$/□, and even more preferably lower than or equal to 50 $\Omega$/□.

In Embodiment 1, the first conductive film 11a is preferably covered with the first electrode layer 9 as shown in FIG. 1. In such a structure, the first electrode layer 9, extended from and along the surface of the first conductive film 11a until the first electrode layer 9 reaches the surface of the first-conductivity-type semiconductor film 3, is formed so as to cover and surround the first conductive film 11a on the surface of the first-conductivity-type semiconductor film 3. The structure therefore further increases adherence between the first conductive film 11a and the first electrode layer 9 over, for example, a structure in which the first conductive film 11a is partially exposed.

In Embodiment 1, the first conductive film 11a is preferably formed like an isolated island as shown in FIG. 1. In such a structure, the first conductive film 11a acts like a wedge, thereby further improving adherence between the first conductive film 11a and the first electrode layer 9. Additionally, the first conductive film 11a with such a shape is easily provided using, for example, photoresist.

In Embodiment 1, the thickness of the first conductive film 11a is preferably less than or equal to half the thickness of the first electrode layer 9. This structure further lowers the contact resistance while sufficiently maintaining the adherence. The thickness of the first conductive film 11a is more preferably less than or equal to half the thickness of the first electrode layer 9 and even more preferably less than or equal to a quarter of the thickness of the first electrode layer 9.

Furthermore, the thickness of the first conductive film 11a is preferably less than or equal to 500 nm and more preferably less than or equal to 20 nm. This structure not only further lowers the contact resistance, but also sufficiently reduces absorption of light by the first conductive film 11a, thereby improving short-circuit current in the photovoltaic element. Additionally, the thickness of the first conductive film 11a is preferably greater than or equal to 5 nm. With a thickness of less than 5 nm, the adherence may not be sufficiently improved.

In Embodiment 1, the contact area A where the first conductive film 11a is in direct contact with the first-conductivity-type semiconductor film 3 is preferably smaller than or equal to the contact area B where the first electrode layer 9 is in direct contact with the first-conductivity-type semiconductor film 3. This structure maintains sufficient adherence and further lowers the contact resistance. The structure also gives an extra area where there is no first conductive film 11a interposed between the first-conductivity-type semiconductor film 3 and the first electrode layer 9, thereby further reducing absorption of light. The contact area A is more preferably smaller than or equal to half the contact area B and even more preferably smaller than or equal to a quarter of the contact area B.

Embodiment 2

Structure of Photovoltaic Element

Figure 18:
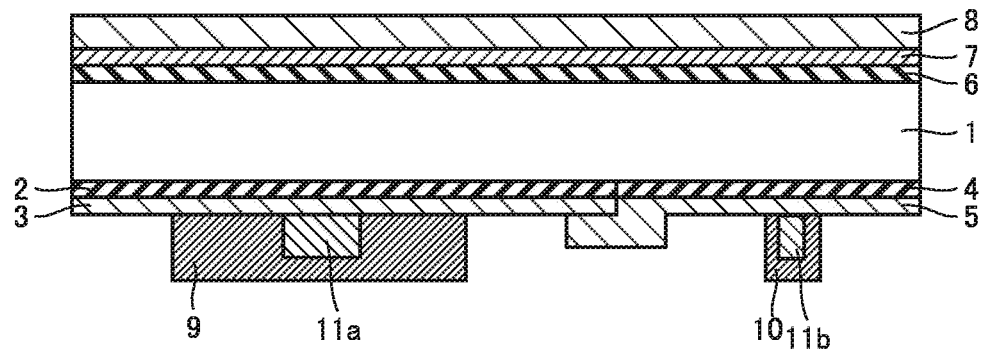
FIG. 18 is a schematic cross-sectional view of a heterojunction hack-contact cell accordance with Embodiment 2.

FIG. 18 is a schematic cross-sectional view of a heterojunction back-contact cell in accordance with Embodiment 2, which is an example of the photovoltaic element of the present invention.

The heterojunction back-contact cell of Embodiment 2 includes a second conductive film 11b provided between the first second-conductivity-type semiconductor film 5 and the second electrode layer 10, as well as the first conductive film 11a provided between the first-conductivity-type semiconductor film 3 and the first electrode layer 9.

Referring to FIG. 1, the second electrode layer 10 is extended along the surface of the second conductive film 11b interposed at a site between the first second-conductivity-type semiconductor film 5 and the second electrode layer 10 until the second electrode layer 10 reaches the surface of the first second-conductivity-type semiconductor film 5. Specifically, the second electrode layer 10 is in direct contact with both the first second-conductivity-type semiconductor film 5 and the second conductive film 11b, and the second conductive film 11b is in direct contact with both the first second-conductivity-type semiconductor film 5 and the second electrode layer 10.

The second conductive film 11b may be any conductive film that exhibits high adherence to the first second-conductivity-type semiconductor film 5 and the second electrode layer 10. Examples include ITO (indium tin oxide), ZnO (zinc oxide), SnO (tin oxide), IWO (tungsten-doped indium oxide), and FTO (fluorine-doped tin oxide). The second conductive film 11b is preferably thinner than the second electrode layer 10, more preferably has a thickness less than or equal to half that of the second electrode layer 10, and even more preferably has a thickness of less than or equal to 20 nm.

Method of Manufacturing Photovoltaic Element

The heterojunction back-contact cell of Embodiment 2 can be manufactured by the same manufacturing method as described in Embodiment 1, except that in the step shown in FIG. 12, the etching mask 14 is formed only on those portions of the conductive film 11 where there should be left the first conductive film 11a and the second conductive film 11b.

Functions and Effects

In Embodiment 2, the first electrode layer 9, provided over the first conductive film 11a, is extended along the surface of the first conductive film 11a until the first electrode layer 9 reaches the surface of the first-conductivity-type semiconductor film 3. In addition, the second electrode layer 10, provided on the second conductive film 11b, is extended along the surface of the second conductive film 11b until the second electrode layer 10 reaches the surface of the first second-conductivity-type semiconductor film 5. This structure improves the properties and reliability of the heterojunction back-contact cell of Embodiment 2.

Specifically, the heterojunction back-contact cell of Embodiment 2 achieves the same effects as those achieved in Embodiment 1 and additionally remedies the problem of low adherence and maintains low contact resistance between the second electrode layer 10 and the first second-conductivity-type semiconductor film 5. Thus, the heterojunction back-contact cell of Embodiment 2 further improves the properties and reliability of the photovoltaic element.

Embodiment 2 is the same as Embodiment 1 except that there is provided the second conductive film 11b between the first second-conductivity-type semiconductor film 5 and the second electrode layer 10. Redundant description is not repeated here.

Embodiment 3

Structure of Photovoltaic Element

Figure 19:
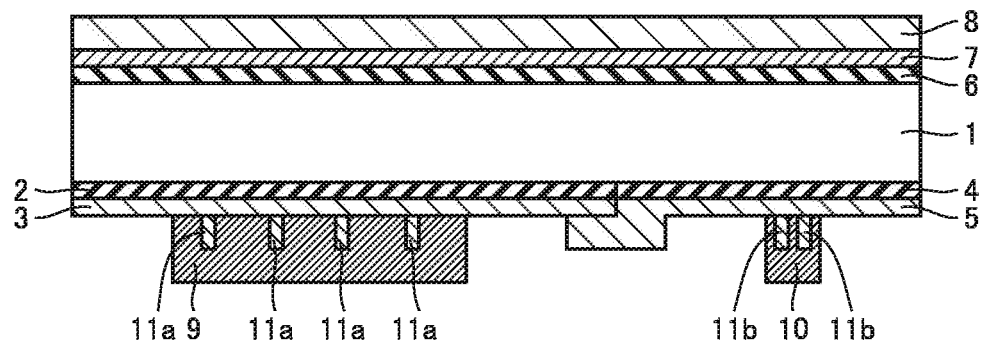
FIG. 19 is a schematic cross-sectional view of a heterojunction back-contact cell in accordance with Embodiment 3.

FIG. 19 is a schematic cross-sectional view of a heterojunction back-contact cell in accordance with Embodiment 3, which is an example of the photovoltaic element of the present invention.

The heterojunction back-contact cell of Embodiment 3 includes a plurality of first conductive films 11a provided between the first-conductivity-type semiconductor film 3 and the first electrode layer 9 and a plurality of second conductive films 11b provided between the first second-conductivity-type semiconductor film 5 and the second electrode layer 10.

Referring to FIG. 19, the mutually isolated first conductive films 11a are provided on the first-conductivity-type semiconductor film 3. The first electrode layer 9 over the first conductive films 11a is extended from and along the surface of each first conductive film 11a, more specifically, in such a manner as to cover the surface of each first conductive film 11a and fill in spaces between adjacent first conductive films 11a, until the first electrode layer 9 reaches the surface of the first-conductivity-type semiconductor film 3.

Likewise, the mutually isolated second conductive films 11b are provided on the first second-conductivity-type semiconductor film 5. The second electrode layer 10 over the plurality of second conductive films 11b is extended from and along the surface of each second conductive film 11b, more specifically, in such a manner as to cover the surface of each second conductive film 11b and fill in spaces between adjacent second conductive films 11b, until the second electrode layer 10 reaches the surface of the first second-conductivity-type semiconductor film 5.

Method of Manufacturing Photovoltaic Element

The heterojunction back-contact cell of Embodiment 3 can be manufactured by the same manufacturing method as described in Embodiment 1, except that in the step shown in FIG. 12, the etching mask 14 is formed only on those portions of the conductive film 11 where there should be left the plurality of first conductive films 11a and the plurality of second conductive films 11b.

When the plurality of first conductive films 11a and the plurality of second conductive films 11b are to be provided, the first conductive films 11a and the second conductive films 11b can be readily formed in a uniform manner, particularly, by mutually isolating them (forming them like islands).

Functions and Effects

In Embodiment 3, the plurality of first conductive films 11a and the plurality of second conductive films 11b are provided respectively on the first-conductivity-type semiconductor film 3 and the first second-conductivity-type semiconductor film 5. The first electrode layer 9 is extended in such a manner as to cover the surfaces of the first conductive films 11a and fill in spaces between the first conductive films 11a until the first electrode layer 9 reaches the surface of the first-conductivity-type semiconductor film 3. Likewise, the second electrode layer 10 is extended in such a manner as to cover the surfaces of the second conductive films 11b and fill in spaces between the second conductive films 11b until the second electrode layer 10 reaches the surface of the first second-conductivity-type semiconductor film 5. This structure improves the properties and reliability of the heterojunction back-contact cell of Embodiment 2.

Specifically, the heterojunction back-contact cell of Embodiment 3 achieves the same effects as those achieved in Embodiment 2 and additionally, by bringing the first electrode layer 9 (second electrode layer 10) into direct contact with the first conductive films 11a (second conductive films 11b) with a greater contact area in a wedge-like arrangement, further improves the adherence between the first electrode layer 9 (second electrode layer 10) and the first conductive films 11a (second conductive films 11b). The heterojunction back-contact cell also improves the contact area between the first electrode layer 9 (second electrode layer 10) and the first-conductivity-type semiconductor film 3 (first second-conductivity-type semiconductor film 5). Thus, the heterojunction back-contact cell of Embodiment 3 further improves the properties and reliability of the photovoltaic element. Only either the first conductive film 11a or the second conductive film 11b may be provided in plurality.

Embodiment 3 is the same as Embodiment 2 except that the plurality of first conductive films 11a is provided in place of the single first conductive film 11*a* and the plurality of second conductive films 11*b* is provided in place of the single second conductive film 11*b*. Redundant description is not repeated here.

Embodiment 4

Structure of Photovoltaic Element

Figure 20:
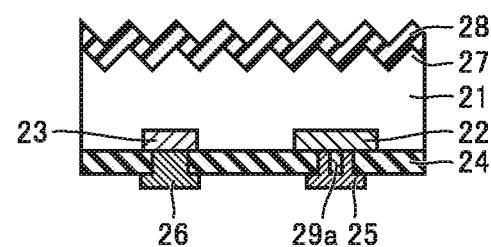
FIG. 20 is a schematic cross-sectional view of an impurity-diffused back-contact cell in accordance with Embodiment 4.
Figure 21:
FIG. 21 is a schematic cross-sectional view showing an exemplary method of manufacturing an impurity-diffused hack-contact cell in accordance with Embodiment 4.

FIG. 20 is a schematic cross-sectional view of an impurity-diffused back-contact cell in accordance with Embodiment 4, which is an example of the photovoltaic element of the present invention.

The impurity-diffused back-contact cell of Embodiment 4 includes: a semiconductor substrate 21 composed of an n-type monocrystal silicon substrate; a first-conductivity-type impurity diffusion region 22 (first semiconductor region) provided on a part of one of the surfaces (back face) of the semiconductor substrate 1; and a second-conductivity-type impurity diffusion region 23 (second semiconductor region) provided on another part of the back face of the semiconductor substrate 1. The impurity-diffused back-contact cell of Embodiment 4 further includes a passivation film 24 on the back face of the semiconductor substrate 1. The passivation film 24 has contact holes that are opened at portions that correspond to parts of the surfaces of the first-conductivity-type impurity diffusion region 22 and the second-conductivity-type impurity diffusion region 23.

The impurity-diffused back-contact cell of Embodiment 4 further includes: a first conductive film 29*a* provided on the first-conductivity-type impurity diffusion region 22 which is exposed in some of the contact holes; and a first electrode layer 25 provided over the first conductive film 29*a*. The impurity-diffused back-contact cell of Embodiment 4 further includes: a second electrode layer 26 provided on the second-conductivity-type impurity diffusion region 23 which is exposed in the other contact holes.

The impurity-diffused back-contact cell of Embodiment 4 further includes: a texture structure 27 formed on the other surface (light-receiving face) of the semiconductor substrate 21; and an antireflective film 28 provided on the texture structure 27.

Referring to FIG. 20, the first electrode layer 25 is extended along the surface of the first conductive film 29*a* interposed at a site between the first-conductivity-type impurity diffusion region 22 and the first electrode layer 25 until the first electrode layer 25 reaches the surface of the first-conductivity-type impurity diffusion region 22. Specifically, the first electrode layer 25 is in direct contact with both the first-conductivity-type impurity diffusion region 22 and the first conductive film 29*a*, and the first conductive film 29*a* is in direct contact with both the first-conductivity-type impurity diffusion region 22 and the first electrode layer 25.

The semiconductor substrate 21 is preferably, but by no means limited to, for example, an n-type monocrystal silicon substrate and may be, as an example, a conventionally known semiconductor substrate. The semiconductor substrate 1 is not particularly limited in thickness and may have a thickness of, for example, from 50 μm to 300 μm, inclusive, and preferably from 100 μm to 300 μm, inclusive. The semiconductor substrate 1 is not particularly limited in specific resistance and may have a specific resistance of, for example, from 0.1 Ω·cm to 10 Ω·cm, inclusive. The n-type impurity may have an approximate concentration of, for example, from $1 \times 10^{18}$ atoms/cm$^3$ to $10^{20}$ atoms/cm$^3$, inclusive.

The p-type impurity in the first-conductivity-type impurity diffusion region 22 may have an approximate concentration of, for example, from $1 \times 10^{18}$ atoms/cm$^3$ to $10^{20}$ atoms/cm$^3$, inclusive. The p-type impurity may be, for example, boron. The n-type impurity in the second-conductivity-type impurity diffusion region 23 may have an approximate concentration of, for example, from $1 \times 10^{18}$ atoms/cm$^3$ to $1 \times 10^{20}$ atoms/cm$^3$, inclusive. The n-type impurity may be, for example, phosphorus.

Each of the passivation film 24 and the antireflective film 28 may be, as an example, either an oxide layer or a nitride layer or a combination of both. The oxide layer may be, as an example, a silicon oxide layer. The nitride layer may be, as an example, a silicon nitride layer. Therefore, each of the passivation film 24 and the antireflective film 28 may be, as an example, a silicon oxide monolayer, a silicon nitride monolayer, or a laminate of silicon oxide and silicon nitride layers. The passivation film 24 and the antireflective film 28 may each have a thickness of, for example, from 40 nm to 800 nm, inclusive.

Each of the first electrode layer 25 and the second electrode layer 26 may be made of any conductive material with no particular limitation and are preferably made of either aluminum or silver or a combination of both. The first electrode layer 25 needs to be thicker than the first conductive film 29*a* and may have a thickness of, for example, less than or equal to 0.5 μm. The second electrode layer 26 is not particularly limited in thickness and may have a thickness of, for example, less than or equal to 0.5 μm.

The first conductive film 29*a* may be any conductive film that exhibits high adherence to the first-conductivity-type impurity diffusion region 22 and the first electrode layer 25. Examples include ITO (indium tin oxide), ZnO (zinc oxide), SnO (tin oxide), IWO (tungsten-doped indium oxide), and FTO (fluorine-doped tin oxide). The first conductive film 29*a* is preferably thinner than the first electrode layer 25, more preferably has a thickness less than or equal to half that of the first electrode layer 9, and even more preferably has a thickness of less than or equal to 20 nm.

Method of Manufacturing Photovoltaic Element

The following will describe an exemplary method of manufacturing an impurity-diffused back-contact cell in accordance with Embodiment 4 in reference to the schematic cross-sectional views in FIGS. 21 to 31. First, referring to FIG. 21, a diffusion-preventive masking layer 60 is formed on one of the surfaces (back face) of the semiconductor substrate 21, and a diffusion-preventive masking layer 61 is formed on the other surface (light-receiving face) of the semiconductor substrate 21.

Each of the diffusion-preventive masking layer 60 and the diffusion-preventive masking layer 61 may be, for example, either an oxide layer or a nitride layer or a combination of both. The oxide layer may be, as an example, a silicon oxide layer. The nitride layer may be, as an example, a silicon nitride layer. Therefore, each of the diffusion-preventive masking layer 60 and the diffusion-preventive masking layer 61 may be, as an example, a silicon oxide monolayer, a silicon nitride monolayer, or a laminate of silicon oxide and silicon nitride layers.

Each of the diffusion-preventive masking layer 60 and the diffusion-preventive masking layer 61 is not particularly limited in thickness and may have a thickness of, for example, from 200 nm to 400 nm, inclusive. The diffusion-preventive masking layer 60 and the diffusion-preventive masking layer 61 may be formed by any method, including normal pressure CVD (chemical vapor deposition), plasma CVD, steam oxidation, and SOG (spin on glass) coating and baking.

Figure 22:
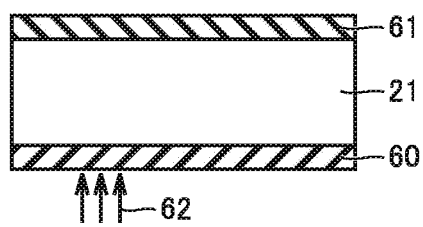
FIG. 22 is a schematic cross-sectional view showing an exemplary method of manufacturing an impurity-diffused back-contact cell in accordance with Embodiment 4.
Figure 23:
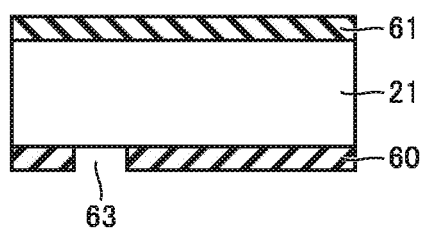
FIG. 23 is a schematic cross-sectional view showing an exemplary method of manufacturing an impurity-diffused back-contact cell in accordance with Embodiment 4.

Next, referring to FIG. 22, laser light 62 is shone onto those portions of the diffusion-preventive masking layer 60 where the second-conductivity-type impurity diffusion region 23 is to be formed. This step removes the portions of the diffusion-preventive masking layer 60 irradiated with the laser light 62, forming an opening 63 as shown in FIG. 23.

Figure 24:
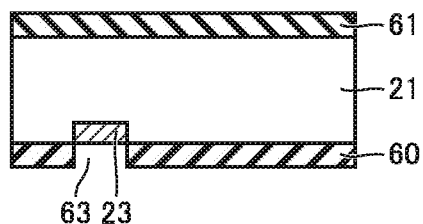
FIG. 24 is a schematic cross-sectional view showing an exemplary method of manufacturing an impurity-diffused back-contact cell in accordance with Embodiment 4.

Next, referring to FIG. 24, an n-type impurity is diffused in the back face of the semiconductor substrate 21 via the opening 63 in the diffusion-preventive masking layer 60, which forms the second-conductivity-type impurity diffusion region 23.

The second-conductivity-type impurity diffusion region 23 may be formed by, for example, vapor-phase diffusion in which $POCl_3$ is used which contains phosphorus as an n-type impurity or coating diffusion in which a phosphorus-containing solvent is spin-coated and annealed at high temperature.

Figure 25:
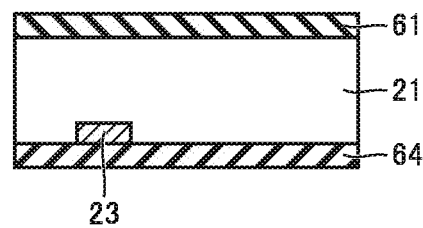
FIG. 25 is a schematic cross-sectional view showing an exemplary method of manufacturing an impurity-diffused back-contact cell in accordance with Embodiment 4.

Next, referring to FIG. 25, after removing the PSG (phosphorus silicate glass) layer formed by the diffusion of the n-type impurity and the diffusion-preventive masking layer 60, a diffusion-preventive masking layer 64 is formed on the back face of the semiconductor substrate 21. The diffusion-preventive masking layer 64 is formed as described above, and the description is not repeated here.

Figure 26:
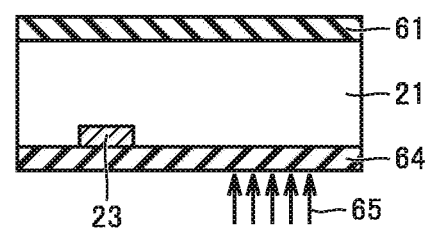
FIG. 26 is a schematic cross-sectional view showing an exemplary method of manufacturing an impurity-diffused back-contact cell in accordance with Embodiment 4.
Figure 27:
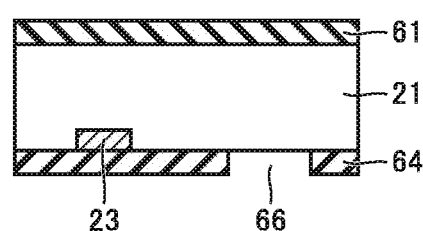
FIG. 27 is a schematic cross-sectional view showing an exemplary method of manufacturing an impurity-diffused hack-contact cell in accordance with Embodiment 4.

Next, referring to FIG. 26, laser light 65 is shone onto those portions of the diffusion-preventive masking layer 64 where the first-conductivity-type impurity diffusion region 22 is to be formed. This step removes the portions of the diffusion-preventive masking layer 64 irradiated with the laser light 65, forming opening 66 as shown in FIG. 27.

Figure 28:
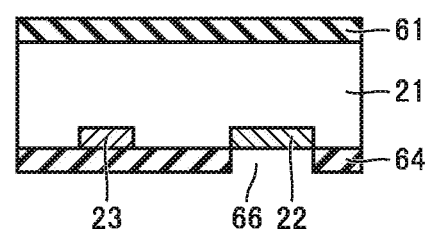
FIG. 28 is a schematic cross-sectional view showing an exemplary method of manufacturing an impurity-diffused back-contact cell in accordance with Embodiment 4.

Next, referring to FIG. 28, a p-type impurity is diffused in the back face of the semiconductor substrate 21 via the opening 66 in the diffusion-preventive masking layer 64, which forms the first-conductivity-type impurity diffusion region 22.

The first-conductivity-type impurity diffusion region 22 may be formed by, for example, vapor-phase diffusion in which $BBr_3$ is used which contains boron as a p-type impurity or coating diffusion in which a phosphorus-containing solvent is spin-coated and annealed at high temperature.

Figure 29:
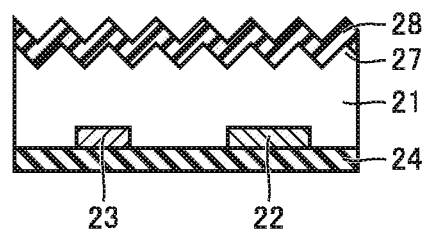
FIG. 29 is a schematic cross-sectional view showing an exemplary method of manufacturing an impurity-diffused back-contact cell in accordance with Embodiment 4.

Next, referring to FIG. 29, after removing the BSG (boron silicate glass) layer formed by the diffusion of the p-type impurity and the diffusion-preventive masking layer 64, the passivation film 24 is formed on the back face of the semiconductor substrate 21. The light-receiving face of the semiconductor substrate 21 is then texture-etched using this passivation film 24 as a texture etching mask, which forms the texture structure 27. Thereafter, the antireflective film 28 is formed on the texture structure 27 on the light-receiving face of the semiconductor substrate 21.

For the texture etching of the semiconductor substrate 21, for example, a solution may be used that is obtained by heating up to 70 to 80° C. an alkaline solution containing a few % isopropyl alcohol in a few % sodium hydroxide or potassium hydroxide solution.

The passivation film 24 and the antireflective film 28 may be formed by any method, including steam oxidation, normal pressure CVD, SOG coating and baking, plasma CVD, and normal pressure CVD. Specifically, a silicon oxide layer can be readily formed by, for example, steam oxidation, normal pressure CVD, or SOG coating and baking. A silicon nitride layer can be readily formed by, for example, plasma CVD or normal pressure CVD.

Figure 30:
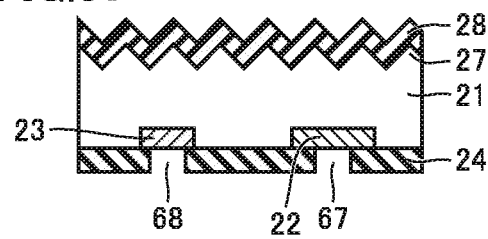
FIG. 30 is a schematic cross-sectional view showing an exemplary method of manufacturing an impurity-diffused back-contact cell in accordance with Embodiment 4.

Next, referring to FIG. 30, contact holes 67 and 68 are formed through the passivation film 24 so that the surface of the first-conductivity-type impurity diffusion region 22 is exposed in the contact hole 67 and the surface of the second-conductivity-type impurity diffusion region 23 is exposed in the contact hole 68. The contact holes 67 and 68 may be formed by any method, including laser radiation as is the case with the openings 66.

Figure 31:
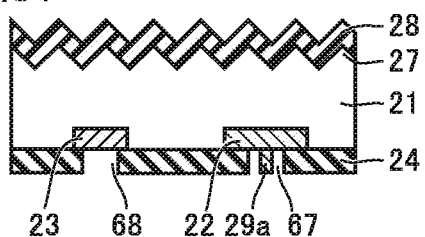
FIG. 31 is a schematic cross-sectional view showing an exemplary method of manufacturing an impurity-diffused back-contact cell in accordance with Embodiment 4.

Next, referring to FIG. 31, the first conductive film 29a is formed on the surface of the first-conductivity-type impurity diffusion region 22 exposed in the contact hole 67. The first conductive film 29a may be formed by any method. As an example, the first conductive film 29a may be formed in a manner similar to Embodiment 1, by forming a conductive film in such a manner as to cover the entire face exposed on the back face of the semiconductor substrate 21, forming an etching mask only on those portions of this conductive film where there should be left unetched the first conductive film 29a, etching the conductive film using the etching mask, and subsequently removing the etching mask.

Next, referring to FIG. 20, the first electrode layer 25 is formed on the first-conductivity-type impurity diffusion region 22 exposed below the passivation film 24, the first conductive film 29a provided on the region 22, and those portions of the passivation film 24 which are located near the contact hole 67. Likewise, the second electrode layer 26 is formed on the second-conductivity-type impurity diffusion region 23 exposed below the passivation film 24 and on those portions of the passivation film 24 which are located near the contact hole 68.

The first electrode layer 25 and the second electrode layer 26 may be formed by any method. As an example, the first electrode layer 25 and the second electrode layer 26 may be formed in a manner similar to Embodiment 1, by forming a metal layer by sputtering or vapor deposition in such a manner as to cover the entire face exposed on the back face of the semiconductor substrate 21, forming an etching mask only on those portions of this metal layer where there should be left unetched the first electrode layer 25 and the second electrode layer 26, etching the metal layer using the etching mask, and subsequently removing the etching mask.

Hence, an impurity-diffused hack-contact cell is provided in accordance with Embodiment 4 as shown in FIG. 20.

Functions and Effects

In Embodiment 4, the first conductive film 29a is provided on the first-conductivity-type impurity diffusion region 22 (first semiconductor region). The first electrode layer 25, provided over the first conductive film 29a, is extended along the surface of the first conductive film 29a until the first electrode layer 25 reaches the surface of the first-conductivity-type impurity diffusion region 22. This structure improves the properties and reliability of the impurity-diffused back-contact cell of Embodiment 4, which will be described here by comparing it with other structures.

If no first conductive film 29a was interposed between the first-conductivity-type impurity diffusion region 22 and the first electrode layer 25, the mechanical strength of the first-conductivity-type impurity diffusion region 22 and the first electrode layer 25 would depend significantly on their adherence. Because silicon semiconductor has relatively low adherence to metal, the first electrode layer 25 would easily come off the first-conductivity-type impurity diffusion region 22. Meanwhile, if there was interposed an additional member across the entire interface of the first-conductivity-type impurity diffusion region 22 and the first electrode layer 25 to restrain the first electrode layer 25 from coming off, the first electrode layer 25 would have a greater contact resistance than if no such additional member is interposed.

In contrast, the problem of the coming-off first electrode layer 25 is remedied by Embodiment 4 in which the first conductive film 29a is interposed at a site between the first-conductivity-type impurity diffusion region 22 and the first electrode layer 25, because the first conductive film 29a exhibits high adherence to the silicon semiconductor and the metal. In addition, some portions of the first electrode layer 25 are in direct contact with the first-conductivity-type impurity diffusion region 22. This structure suppresses contact resistance increases that would occur if there was interposed an additional member across the entire interface of the first-conductivity-type impurity diffusion region 22 and the first electrode layer 25. Thus, the impurity-diffused back-contact cell of Embodiment 4 improves the properties and reliability of the photovoltaic element.

To lower the contact resistance, the sheet resistance of the first conductive film 29a is preferably lower than the sheet resistance of the first-conductivity-type impurity diffusion region 22, more preferably lower than or equal to 500 MΩ/□, and even more preferably lower than or equal to 50 Ω/□.

In Embodiment 4, the first conductive film 29a is preferably covered with the first electrode layer 25 as shown in FIG. 20. In such a structure, the first electrode layer 25, extended from and along the surface of the first conductive film 29a until the first electrode layer 25 reaches the surface of the first-conductivity-type impurity diffusion region 22, is formed so as to cover and surround the first conductive film 29a on the surface of the first-conductivity-type impurity diffusion region 22. The structure therefore further increases adherence between the first conductive film 29a and the first electrode layer 25 over, for example, a structure in which the first conductive film 29a is partially exposed.

In Embodiment 4, the first conductive film 29a is preferably formed like an isolated island as shown in FIG. 20. In this structure, the first conductive film 29a acts like a wedge, thereby further improving adherence between the first conductive film 29a and the first electrode layer 25. Additionally, the first conductive film 29a with such a shape is easily provided using, for example, photoresist.

In Embodiment 4, the thickness of the first conductive film 29a is preferably less than or equal to half the thickness of the first electrode layer 25. This structure further lowers the contact resistance while sufficiently maintaining the adherence. The thickness of the first conductive film 29a is more preferably less than or equal to half the thickness of the first electrode layer 25 and even more preferably less than or equal to a quarter of the thickness of the first electrode layer 25.

Furthermore, the thickness of the first conductive film 29a is preferably less than or equal to 500 nm and more preferably less than or equal to 20 nm. This structure not only further lowers the contact resistance, but also sufficiently reduces absorption of light by the first conductive film 29a, thereby improving short-circuit current in the photovoltaic element. Additionally, the thickness of the first conductive film 29a is preferably greater than or equal to 5 nm. With a thickness of less than 5 nm, the adherence may not be sufficiently improved.

In Embodiment 4, the contact area A where the first conductive film 29a is in direct contact with the first-conductivity-type impurity diffusion region 22 is preferably smaller than or equal to the contact area B where the first electrode layer 25 is in direct contact with the first-conductivity-type impurity diffusion region 22. This structure maintains sufficient adherence and further lowers the contact resistance. The structure also gives an extra area where there is no first conductive film 29a interposed between the first-conductivity-type impurity diffusion region 22 and the first electrode layer 25, thereby further reducing absorption of light. The contact area A is more preferably smaller than or equal to half the contact area B and even more preferably smaller than or equal to a quarter of the contact area B.

Embodiment 5

Structure of Photovoltaic Element

Figure 32:
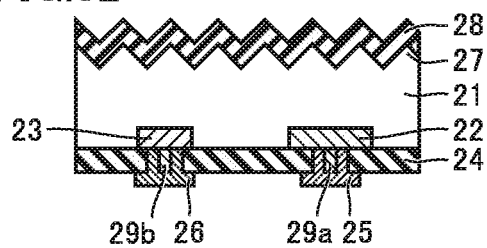
FIG. 32 is a schematic cross-sectional view of an impurity-diffused back-contact cell in accordance with Embodiment 5.

FIG. 32 is a schematic cross-sectional view of an impurity-diffused back-contact cell in accordance with Embodiment 5, which is an example of the photovoltaic element of the present invention.

The impurity-diffused back-contact cell of Embodiment 5 includes a second conductive film 29b provided between the second-conductivity-type impurity diffusion region 23 and the second electrode layer 26, as well as the first conductive film 29a provided between the first-conductivity-type it purity diffusion region 22 and the first electrode layer 25.

Referring to FIG. 32, the second electrode layer 26 is partly extended along the surface of the second conductive film 29b until the second electrode layer 26 reaches the surface of the second-conductivity-type impurity diffusion region 23. Specifically, the second electrode layer 26 is in direct contact with both the second-conductivity-type impurity diffusion region 23 and the second conductive film 29b, and the second conductive film 29b is in direct contact with both the second-conductivity-type impurity diffusion region 23 and the second electrode layer 26.

The second conductive film 29b may be any conductive film that exhibits high adherence to the second-conductivity-type impurity diffusion region 23 and the second electrode layer 26. Examples include ITO (indium tin oxide), ZnO (zinc oxide), SnO (tin oxide), IWO (tungsten-doped indium oxide), and FTO (fluorine-doped tin oxide). The conductive film 29b is preferably thinner than the second electrode layer 26, more preferably has a thickness less than or equal to half that of the second electrode layer 26, and even more preferably has a thickness of less than or equal to 20 nm.

Method of Manufacturing Photovoltaic Element

The impurity-diffused back-contact cell of Embodiment 5 can be manufactured by the same manufacturing method as described in Embodiment 4, except that in the step shown in FIG. 31, the second conductive film 29b is formed at the same time as the first conductive film 29a.

Functions and Effects

In Embodiment 5, the first electrode layer 25, provided over the first conductive film 29a, is extended along the surface of the first conductive film 29a until the first electrode layer 25 reaches the surface of the first-conductivity-type impurity diffusion region 22. In addition, the second electrode layer 26, provided on the second conductive film 29b, is extended along the surface of the second conductive film 29b until the second electrode layer 26 reaches the surface of the second-conductivity-type impurity diffusion region 23. This structure improves the properties and reliability of the impurity-diffused back-contact cell of Embodiment 5.

Specifically, the impurity-diffused back-contact cell of Embodiment 5 achieves the same effects as those achieved in Embodiment 4 and additionally remedies the problem of low adherence and maintains low contact resistance between the second electrode layer 26 and the second-conductivity-type impurity diffusion region 23. Thus, the impurity-diffused back-contact cell of Embodiment 5 further improves the properties and reliability of the photovoltaic element.

Embodiment 5 is the same as Embodiment 4 except that there is provided the second conductive film 29b between the second-conductivity-type impurity diffusion region 23 and the second electrode layer 26. Redundant description is not repeated here.

Embodiment 6

Structure of Photovoltaic Element

Figure 33:
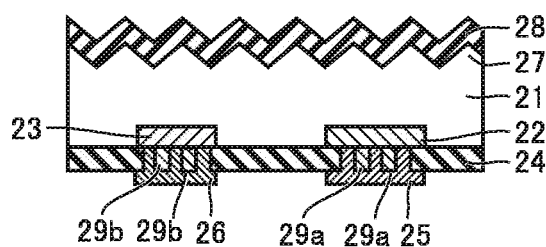
FIG. 33 is a schematic cross-sectional view of an impurity-diffused back-contact cell in accordance with Embodiment 6.

FIG. 33 is a schematic cross-sectional view of an impurity-diffused back-contact cell in accordance with Embodiment 6, which is an example of the photovoltaic element of the present invention.

The impurity-diffused back-contact cell of Embodiment 6 includes: a plurality of first conductive films 29a provided between the first-conductivity-type impurity diffusion region 22 and the first electrode layer 25; and a plurality of second conductive films 29b provided between the second-conductivity-type impurity diffusion region 23 and the second electrode layer 26.

Referring to FIG. 33, the mutually isolated first conductive films 29a are provided on the first-conductivity-type impurity diffusion region 22. The first electrode layer 25 over the first conductive films 29a is extended from and along the surface of each first conductive film 29a, more specifically, in such a manner as to cover the surface of each first conductive film 29a and fill in spaces between adjacent first conductive films 29a, until the first electrode layer 25 reaches the surface of the first-conductivity-type impurity diffusion region 22.

Likewise, the mutually isolated second conductive films 29b are provided on the second-conductivity-type impurity diffusion region 23. The second electrode layer 26 over the plurality of second conductive films 29b is extended from and along the surface of each second conductive film 29b, more specifically, in such a manner as to cover the surface of each second conductive film 29b and fill in spaces between adjacent second conductive films 29b, until the second electrode layer 26 reaches the surface of the second-conductivity-type impurity diffusion region 23.

Method of Manufacturing Photovoltaic Element

The impurity-diffused back-contact cell of Embodiment 6 can be manufactured by the same manufacturing method as described in Embodiment 4, except that in the step shown in FIG. 31, the plurality of first conductive films 29a and the plurality of second conductive films 29b are formed.

When the plurality of first conductive films 29a and the plurality of second conductive films 29b are to be provided, the first conductive films 29a and the second conductive films 29b can be readily formed in a uniform manner, particularly, by mutually isolating them (forming them like islands).

Functions and Effects

In Embodiment 6, the plurality of first conductive films 29a and the plurality of second conductive films 29b are provided respectively on the first-conductivity-type impurity diffusion region 22 and the second-conductivity-type impurity diffusion region 23. The first electrode layer 25 is extended in such a manner as to cover the surfaces of the first conductive films 29a and fill in spaces between the first conductive films 29a until the first electrode layer 25 reaches the surface of the first-conductivity-type impurity diffusion region 22. Likewise, the second electrode layer 26 is extended in such a manner as to cover the surfaces of the second conductive films 29b and fill in spaces between the second conductive films 29b until the second electrode layer 26 reaches the surface of the second-conductivity-type impurity diffusion region 23. This structure improves the properties and reliability of the impurity-diffused back-contact cell of Embodiment 6.

Specifically, the impurity-diffused back-contact cell of Embodiment 6 achieves the same effects as those achieved in Embodiment 5 and additionally, by bringing the first electrode layer 25 (second electrode layer 26) into direct contact with the first conductive films 29a (second conductive films 29b) with a greater contact area in a wedge-like arrangement, further improves the adherence between the first electrode layer 25 (second electrode layer 26) and the first conductive films 29a (second conductive films 29b). The impurity-diffused back-contact cell also improves the contact area between the first electrode layer 25 (second electrode layer 26) and the first-conductivity-type impurity diffusion region 22 (second-conductivity-type impurity diffusion region 23). Thus, the impurity-diffused back-contact cell of Embodiment 6 further improves the properties and reliability of the photovoltaic element. Only either the first conductive film 29a or the second conductive film 29b may be provided in plurality.

Embodiment 6 is the same as Embodiment 5 except that the plurality of first conductive films 29a is provided in place of the single first conductive film 29a and the plurality of second conductive films 29b is provided in place of the single second conductive film 29b. Redundant description is not repeated here.

Embodiment 7

Structure of Photovoltaic Element

Figure 34:
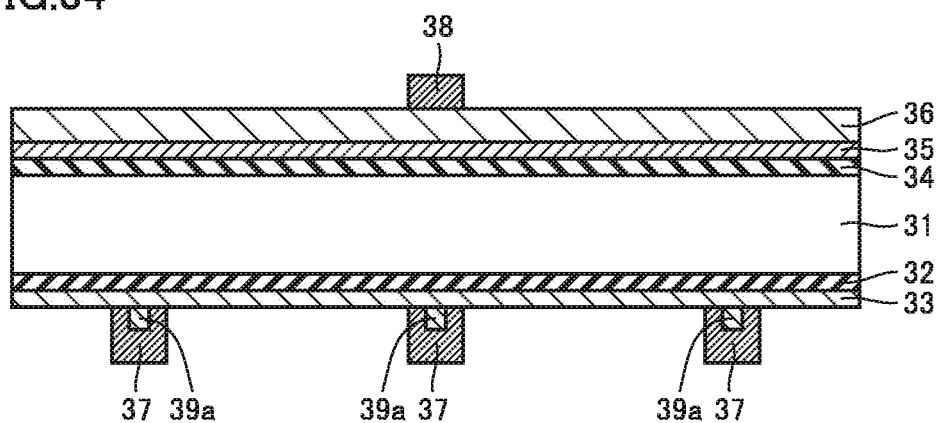
FIG. 34 is a schematic cross-sectional view of a heterojunction double-side-electrode cell in accordance with Embodiment 7.
Figure 35:
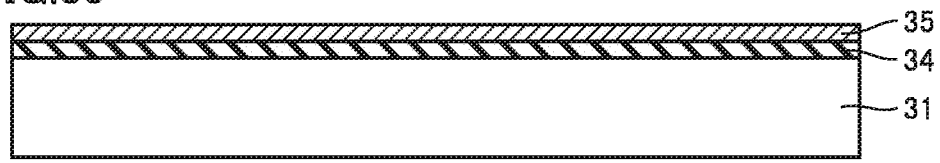
FIG. 35 is a schematic cross-sectional view showing an exemplary method of manufacturing a heterojunction double-side-electrode cell in accordance with Embodiment 7.

FIG. 34 is a schematic cross-sectional view of a heterojunction double-side-electrode cell of Embodiment 7, which is an example of the photovoltaic element of the present invention.

The heterojunction double-side-electrode cell of Embodiment 7 includes: a semiconductor substrate 31 composed of a p-type monocrystal silicon substrate; a first i-type semiconductor film 32 composed of an i-type amorphous silicon film provided on an entire one of the surfaces (back face) of the semiconductor substrate; a first-conductivity-type semiconductor film 33 (first semiconductor region) composed of a p-type amorphous silicon film provided on an entire face of the first i-type semiconductor film 32; first conductive films 39a provided on parts of the first-conductivity-type semiconductor film 33; and first electrode strips (first electrode layer) 37 provided over the first conductive films 39a.

The heterojunction double-side-electrode cell of Embodiment 7 further includes: a second i-type semiconductor film 34 composed of an i-type amorphous silicon film provided on the entire, other surface (light-receiving face) of the semiconductor substrate 31; a second-conductivity-type semiconductor film 35 (second semiconductor region) composed of an n-type amorphous silicon film provided on an entire face of the second i-type semiconductor film 34; an antireflective film 36 provided on an entire face of the second-conductivity-type semiconductor film 35; and a second electrode layer 38 provided on a part of a face of the antireflective film 36.

Referring to FIG. 34, each first electrode strip 37 is extended along the surface of the first conductive film 39a interposed at a site between the first-conductivity-type semiconductor film 33 and the first electrode strip 37 until the first electrode strip 37 reaches the surface of the first-conductivity-type semiconductor film 33. Specifically, the first electrode strip 37 is in direct contact with both the first-conductivity-type semiconductor film 33 and the first conductive films 39a, and each first conductive film 39a is in direct contact with both the first-conductivity-type semiconductor film 33 and the first electrode strip 37.

The semiconductor substrate 31 is preferably, but by no means limited to, a p-type monocrystal silicon substrate and may be, as an example, a conventionally known semiconductor substrate. The semiconductor substrate 31 is not particularly limited in thickness and may have a thickness of, for example, from 50 μm to 300 μm, inclusive, and preferably from 100 μm to 200 μm, inclusive. The semiconductor substrate 31 is not particularly limited in specific resistance and may have a specific resistance of, for example, from 0.1 Ω·cm to 10 Ω·cm, inclusive. The p-type impurity may have an approximate concentration of, for example, from $1\times10^{18}$ atoms/cm$^3$ to $1\times10^{20}$ atoms/cm$^3$, inclusive. It will be appreciated that the semiconductor substrate 31 has a higher impurity concentration than an i-type semiconductor substrate.

The first i-type semiconductor film 32 is preferably, but by no means limited to, an i-type amorphous silicon film and may be, as an example, a conventionally known i-type semiconductor film. The first i-type semiconductor film 32 is not particularly limited in thickness and may have a thickness of, for example, from 1 nm to 50 nm, inclusive.

The first-conductivity-type semiconductor film 33 is preferably, but by no means limited to, a p-type amorphous silicon film and may be, as an example, a conventionally known p-type semiconductor film. The first-conductivity-type semiconductor film 33 may contain, for example, boron as a p-type impurity. The p-type impurity may have a concentration of, for example, approximately $5\times10^{19}$ atoms/cm$^3$. The first-conductivity-type semiconductor film 33 is not particularly limited in thickness and may have a thickness of, for example, from 5 nm to 50 nm, inclusive.

The second i-type semiconductor film 34 is preferably, but by no means limited to, an i-type amorphous silicon film and may be, as an example, a conventionally known i-type semiconductor film. The second i-type semiconductor film 34 is not particularly limited in thickness and may have a thickness of, for example, from 1 nm to 50 nm, inclusive.

The second-conductivity-type semiconductor film 35 is preferably, but by no means limited to, an n-type amorphous silicon film and may be, as an example, a conventionally known n-type semiconductor film. The second-conductivity-type semiconductor film 35 may contain, for example, phosphorus as an n-type impurity. The n-type impurity may have a concentration of, for example, approximately $5\times10^{19}$ atoms/cm$^3$. The second-conductivity-type semiconductor film 35 is not particularly limited in thickness and may have a thickness of, for example, from 5 nm to 50 nm, inclusive.

The antireflective film 36 may be, as an example, either an oxide layer or a nitride layer or a combination of both. The oxide layer may be, as an example, a silicon oxide layer. The nitride layer may be, as an example, a silicon nitride layer. Therefore, the antireflective film 36 may be, as an example, a silicon oxide monolayer, a silicon nitride monolayer, or a laminate of silicon oxide and silicon nitride layers. The antireflective film 36 may have a thickness of, for example, from 40 nm to 800 nm, inclusive.

The first electrode strips 37 and the second electrode layer 38 may be made of any conductive material with no particular limitation and are preferably made of either aluminum or silver or a combination of both. The first electrode strip 37 needs to be thicker than the first conductive film 39a and may have a thickness of, for example, less than or equal to 0.5 μm. The second electrode layer 38 is not particularly limited in thickness and may have a thickness of, for example, less than or equal to 0.5 μm.

The first conductive film 39a may be any conductive film that exhibits high adherence to the first-conductivity-type semiconductor film 33 and the first electrode strip 37. Examples include ITO (indium tin oxide), ZnO (zinc oxide), SnO (tin oxide), IWO (tungsten-doped indium oxide), and FTO (fluorine-doped tin oxide). A conductive film 39 is preferably thinner than the first electrode strip 37, more preferably has a thickness less than or equal to half that of the first electrode strip 37, and even more preferably has a thickness of less than or equal to 20 nm.

Method of Manufacturing Photovoltaic Element

The following will describe an exemplary method of manufacturing a heterojunction double-side-electrode cell in accordance with Embodiment 7 in reference to the schematic cross-sectional views in FIGS. 35 to 41. First, referring to FIG. 35, the second i-type semiconductor film 34 is formed on the entire light-receiving face of the semiconductor substrate 31, and the second-conductivity-type semiconductor film 35 is formed on an entire face of the second i-type semiconductor film 34.

The second i-type semiconductor film 34 and the second-conductivity-type semiconductor film 3 may be formed by any method, including plasma CVD.

Before forming the second i-type semiconductor film 34 on the light-receiving face of the semiconductor substrate 31, the light-receiving face of the semiconductor substrate 31 may be processed to have irregularities thereon. These irregularities can be formed by, for example, forming a texturing mask on the entire back face of the semiconductor substrate 31 and then texture-etching the light-receiving face of the semiconductor substrate 31. The texturing mask may be made of, for example, silicon nitride or silicon oxide.

Figure 36:
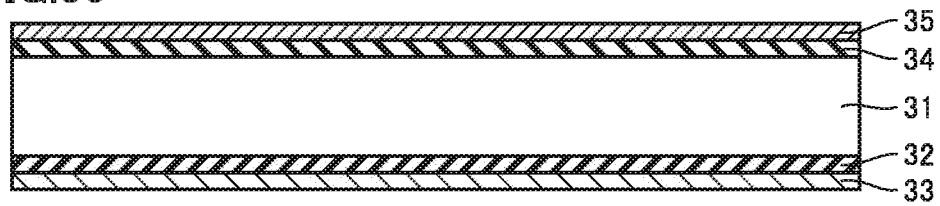
FIG. 36 is a schematic cross-sectional view showing an exemplary method of manufacturing a heterojunction double-side-electrode cell in accordance with Embodiment 7.

Next, referring to FIG. 36, the first i-type semiconductor film 32 is formed on the entire back face of the semiconductor substrate 31, and the first-conductivity-type semiconductor film 33 is formed on an entire face of the first i-type semiconductor film 32. The first i-type semiconductor film 32 and the first-conductivity-type semiconductor film 33 may be formed by any method, including plasma CVD.

Figure 37:
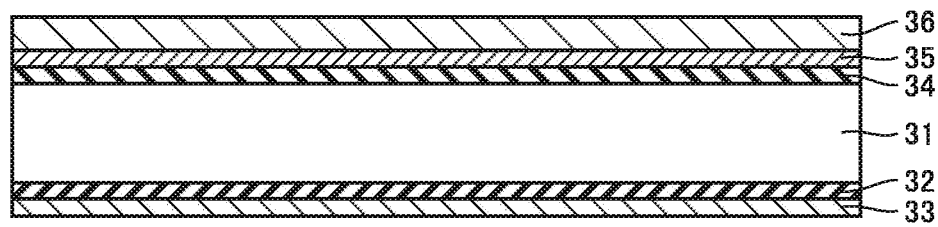
FIG. 37 is a schematic cross-sectional view showing an exemplary method of manufacturing a heterojunction double-side-electrode cell in accordance with Embodiment 7.

Next, referring to FIG. 37, the antireflective film 36 is formed on the entire light-receiving face of the second-conductivity-type semiconductor film 35. The antireflective film 36 may be formed by any method, including steam oxidation, normal pressure CVD, SOG coating and baking, plasma CVD, or normal pressure CVD. Specifically, a silicon oxide layer can be readily formed by, for example, steam oxidation, normal pressure CVD, or SOG coating and baking. A silicon nitride layer can be readily formed by, for example, plasma CVD or normal pressure CVD.

Figure 38:
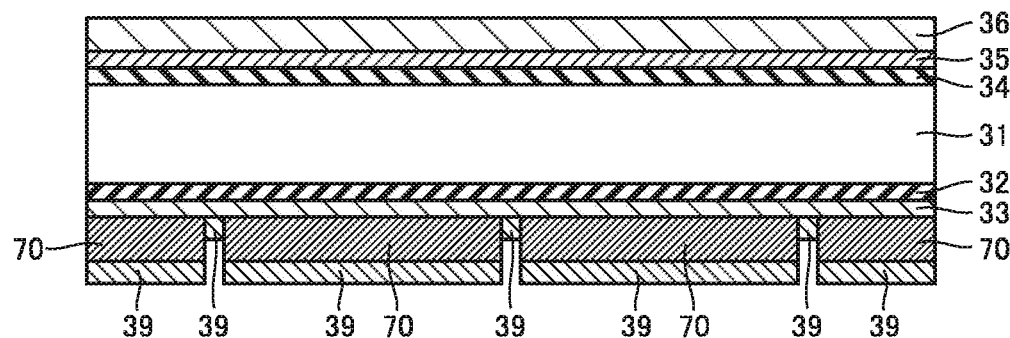
FIG. 38 is a schematic cross-sectional view showing an exemplary method of manufacturing a heterojunction double-side-electrode cell in accordance with Embodiment 7.

Next, referring to FIG. 38, a metal mask 70 is formed on the first-conductivity-type semiconductor film 33. The metal mask 70 has openings where the first conductive films 39a are to be formed. The conductive film 39 is then formed on the entire faces exposed on the back face of the semiconductor substrate 31 in such a manner as to cover the metal mask 70. Each first conductive film 39a is formed within an area where the first electrode strip 37 is to be formed. In other words, each first conductive film 39a is formed in an area that is within, and smaller than, an area where the first electrode strip 37 is to be formed.

Figure 39:
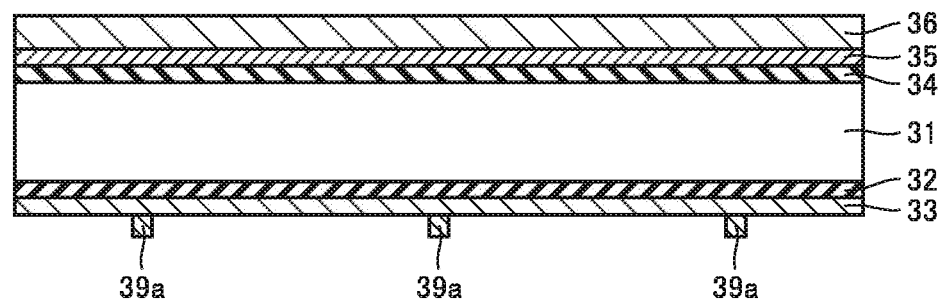
FIG. 39 is a schematic cross-sectional view showing an exemplary method of manufacturing a heterojunction double-side-electrode cell in accordance with Embodiment 7.

Next, referring to FIG. 39, the metal mask 70, together with the conductive film 39 thereon, is removed. This step forms the first conductive films 39a.

Figure 40:
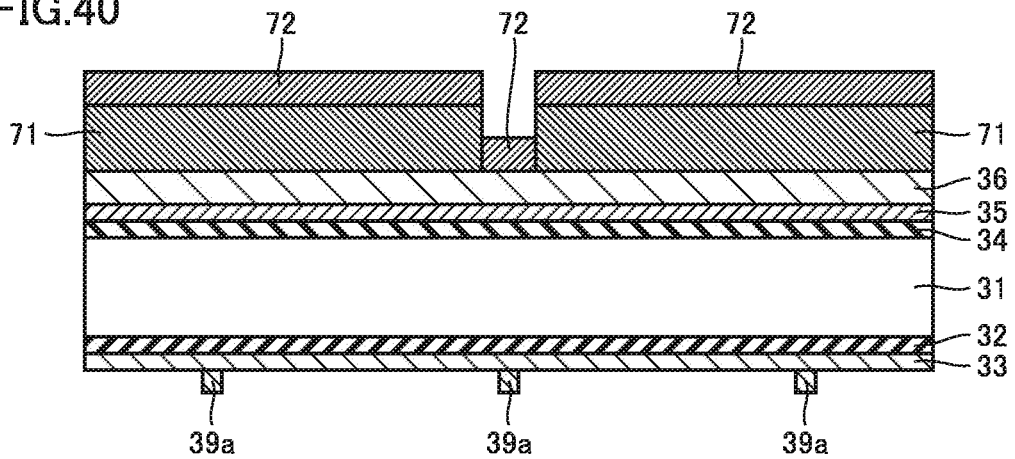
FIG. 40 is a schematic cross-sectional view showing an exemplary method of manufacturing a heterojunction double-side-electrode cell in accordance with Embodiment 7.

Next, referring to FIG. 40, a metal mask 71 is formed on the antireflective film 36. The metal mask 71 has openings where the second electrode layer 38 is to be formed. An electrode layer 72 is then formed by, for example, sputtering or vapor deposition on the entire faces exposed on the light-receiving face of the semiconductor substrate 31 in such a manner as to cover the metal mask 71.

Figure 41:
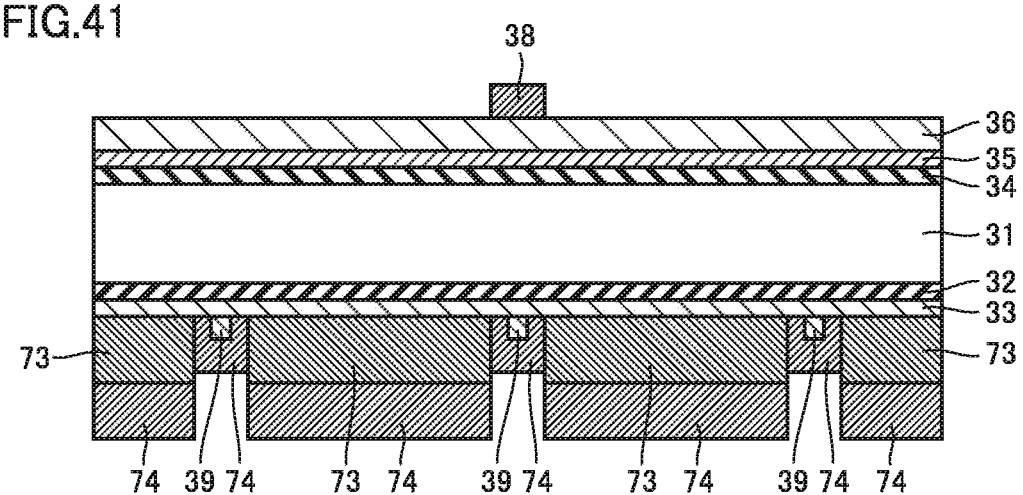
FIG. 41 is a schematic cross-sectional view showing an exemplary method of manufacturing a heterojunction double-side-electrode cell in accordance with Embodiment 7.

Next, referring to FIG. 41, the metal mask 71, together with the electrode layer 72 thereon, is removed. This step forms the second electrode layer 38. Likewise, a metal mask 73 that has openings where the first electrode strips 37 are to formed is formed on the entire face exposed on the back face of the semiconductor substrate 31. An electrode layer 74 is then formed by, for example, sputtering or vapor deposition on the entire faces exposed on the back face of the semiconductor substrate 31 in such a manner as to cover the metal mask 73.

Next, the metal mask 73, together with the electrode layer 74 thereon, is removed, which forms the first electrode strips 37.

Hence, a heterojunction double-side-electrode cell is provided in accordance with Embodiment 7 as shown in FIG. 34.

Functions and Effects

In Embodiment 7, the first conductive films 39a are provided on the first-conductivity-type semiconductor film 33 (first semiconductor region). Each first electrode strip 37, provided over the first conductive film 39a, is extended along the surface of the first conductive film 39a until the first electrode strip 37 reaches the surface of the second-conductivity-type semiconductor film 33. This structure improves the properties and reliability of the heterojunction double-side-electrode cell of Embodiment 7, which will be described here by comparing it with other structures.

If no first conductive films 39a were interposed between the first-conductivity-type semiconductor film 33 and the first electrode strips 37, the mechanical strength of the first-conductivity-type semiconductor film 33 and the first electrode strips 37 would depend significantly on their adherence. Because silicon semiconductor has relatively low adherence to metal, the first electrode strips 37 would easily come off the first-conductivity-type semiconductor film 33. Meanwhile, if there was interposed an additional member across the entire interface of the first-conductivity-type semiconductor film 33 and the first electrode strips 37 to restrain the first electrode strips 37 from coming off, the first electrode strips 37 would have a greater contact resistance than if no such additional member is interposed.

In contrast, the problem of the coming-off first electrode strips 37 is remedied by Embodiment 7 in which the first conductive films 39a are interposed at sites between the first-conductivity-type semiconductor film 33 and the first electrode strips 37, because the first conductive films 39a exhibit high adherence to the silicon semiconductor and the metal. In addition, some portions of the first electrode strips 37 are in direct contact with the first-conductivity-type semiconductor film 33. This structure suppresses contact resistance increases that would occur if there was interposed an additional member across the entire interface of the first-conductivity-type semiconductor film 33 and the first electrode strips 37. Thus, the heterojunction double-side-electrode cell of Embodiment 7 improves the properties and reliability of the photovoltaic element.

To lower the contact resistance, the sheet resistance of the first conductive film 39a is preferably lower than the sheet resistance of the first-conductivity-type semiconductor film 33, more preferably, lower than or equal to 500 MΩ/□, and even more preferably lower than or equal to 50 Ω/□.

In Embodiment 7, the first conductive films 39a are preferably covered with the first electrode strips 37 as shown in FIG. 34. In such a structure, each first electrode strip 37, extended from and along the surface of the first conductive film 39a until the first electrode strip 37 reaches the surface of the first-conductivity-type semiconductor film 33, is formed so as to cover and surround the first conductive films 39a on the surface of the first-conductivity-type semiconductor film 33. The structure therefore further increases adherence between the first conductive films 39a and the first electrode strips 37 over, for example, a structure in which the first conductive films 39a are partially exposed.

In Embodiment 7, the first conductive films 39a are preferably formed like mutually isolated islands as shown in FIG. 34. In this structure, the first conductive films 39a act like wedges, thereby further improving adherence between the first conductive films 39a and the first electrode strips 37. Additionally, the first conductive films 39a with such a shape are easily provided using, for example, a metal mask.

In Embodiment 7, the thickness of the first conductive film 39a is preferably less than or equal to half the thickness of the first electrode strip 27. This structure further lowers the contact resistance while sufficiently maintaining the adherence. The thickness of the first conductive film 39a is more preferably less than or equal to half the thickness of the first electrode strip 27 and even more preferably less than or equal to a quarter of the thickness of the first electrode strip 27.

Furthermore, the thickness of the first conductive film 39a is preferably less than or equal to 500 nm and more preferably less than or equal to 20 nm. This structure not only further lowers the contact resistance, but also sufficiently reduces absorption of light by the first conductive films 39a, thereby improving short-circuit current in the photovoltaic element. Additionally, the thickness of the first conductive film 39a is preferably greater than or equal to 5 nm. With a thickness of less than 5 nm, the adherence may not be sufficiently improved.

In Embodiment 7, the contact area A where the first conductive film 39a is in direct contact with the first-conductivity-type semiconductor film 33 is preferably smaller than or equal to the contact area B where the first electrode strip 37 is in direct contact with the first-conductivity-type semiconductor film 33. This structure maintains sufficient adherence and further lowers the contact resistance. The structure also gives an extra area where there is no first conductive film 39a interposed between the first-conductivity-type semiconductor film 33 and the first electrode strips 27, thereby further reducing absorption of light. The contact area. A is more preferably smaller than or equal to half the contact area. B and even more preferably smaller than or equal to a quarter of the contact area B.

Embodiment 8

Structure of Photovoltaic Element

Figure 42:
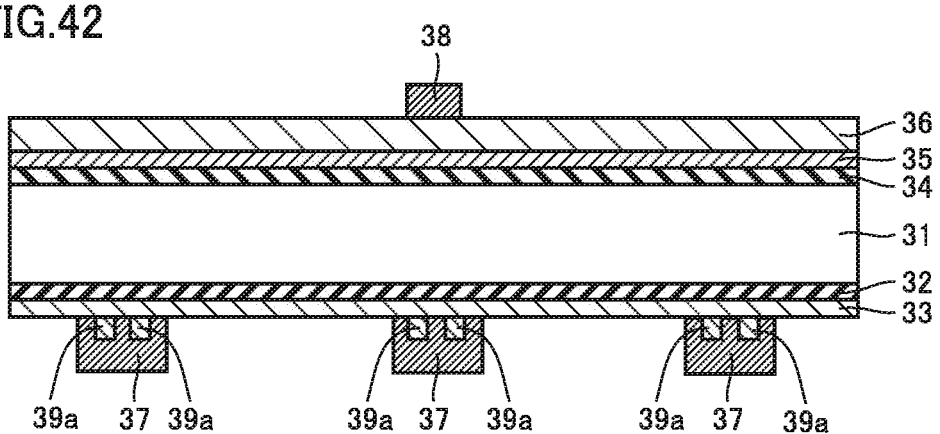
FIG. 42 is a schematic cross-sectional view of a heterojunction double-side-electrode cell in accordance with Embodiment 8.

FIG. 42 is a schematic cross-sectional view of a heterojunction double-side-electrode cell in accordance with Embodiment 8, which is an example of the photovoltaic element of the present invention.

The heterojunction double-side-electrode cell of Embodiment 8 includes a plurality of first conductive films 39a in each first electrode strip 37. Referring to FIG. 42, each of the areas where the first electrode strips (first electrode layer) 37 are to be formed on the first-conductivity-type semiconductor film 33 include a plurality of first conductive films 39a. Each first electrode strip 37 over the first conductive films 39a is extended from and along the surfaces of the first conductive films 39a, more specifically, in such a manner as to cover the surfaces of the first conductive films 39a and fill in spaces between adjacent first conductive films 39*a*, until the first electrode strip 37 reaches the surface of the first-conductivity-type semiconductor film 33.

Method of Manufacturing Photovoltaic Element

The heterojunction double-side-electrode cell of Embodiment 8 can be manufactured by the same manufacturing method as described in Embodiment 7, except that in the step shown in FIG. 38, the plurality of first conductive films 39*a* is formed using the metal mask 70 having openings that correspond to the plurality of first conductive films 39*a*.

When the plurality of first conductive films 39*a* is to be provided, the first conductive films 39*a* can be readily formed in a uniform manner, particularly, by mutually isolating them (forming them like islands).

Functions and Effects

In Embodiment 8, the plurality of first conductive films 39*a* is provided on the first-conductivity-type semiconductor film 33. Each first electrode strip 37 is extended along the surfaces of the first conductive films 39*a* and in such a manner as to fill in spaces between the first conductive films 39*a*, until the first electrode strip 37 reaches the surface of the first-conductivity-type semiconductor film 33. This structure improves the properties and reliability of the heterojunction double-side-electrode cell of Embodiment 8.

Specifically, the heterojunction double-side-electrode cell of Embodiment 8 achieves the same effects as those achieved in Embodiment 7 and additionally, by bringing the first electrode strips 37 into direct contact with the first conductive films 39*a* with a greater contact area in a wedge-like arrangement, further improves the adherence between the first electrode strips 37 and the first conductive films 39*a*. The heterojunction double-side-electrode cell also improves the contact area between the first electrode strips 37 and the first-conductivity-type semiconductor film 33. Thus, the heterojunction double-side-electrode cell of Embodiment 8 improves the properties and reliability of the photovoltaic element.

Embodiment 8 is the same as Embodiment 7 except that the plurality of first conductive films 39*a* is provided in place of the single first conductive film 39*a*. Redundant description is not repeated here.

Throughout Embodiments 1 to 8 above, it has been assumed that the first conductivity type is the p-type, and the second conductivity type is the n-type. The first and second conductivity types only need to be opposite conductivity types. If the first conductivity type is the n-type, the first conductivity type is the p-type.

Additional Remarks (1) The present invention, in a first aspect thereof, provides a photovoltaic element including: a semiconductor substrate; a first i-type semiconductor film on a part of one of surfaces of the semiconductor substrate; a first semiconductor region including a first-conductivity-type semiconductor film on the first i-type semiconductor film; a first electrode layer on the first semiconductor region; a second i-type semiconductor film on another part of that surface of the semiconductor substrate; a second semiconductor region including a second-conductivity-type semiconductor film on the second i-type semiconductor film; a second electrode layer on the second semiconductor region; and a first conductive film interposed between the first semiconductor region and the first electrode layer, wherein the first electrode layer is extended along a surface of the first conductive film until the first electrode layer reaches the first semiconductor region. The present invention, in the first aspect thereof, achieves a superb balance between high adherence and low contact resistance of the first electrode layer when compared with a structure in which there is interposed an additional member across the entire interface of the first semiconductor region and the first electrode layer and a structure in which there is interposed no additional member at all between the first semiconductor region and the first electrode layer. The present invention therefore improves the properties and reliability of the photovoltaic element.

(2) The present invention, in a second aspect thereof, provides a photovoltaic element including: a semiconductor substrate; a first semiconductor region including a first-conductivity-type impurity diffusion region below a part of one of surfaces of the semiconductor substrate; a first electrode layer on the first semiconductor region; a second semiconductor region including a second-conductivity-type impurity diffusion region below another part of that surface of the semiconductor substrate; a second electrode layer on the second semiconductor region; and a first conductive film interposed between the first semiconductor region and the first electrode layer, wherein the first electrode layer is extended along a surface of the first conductive film until the first electrode layer reaches the first semiconductor region. The present invention, in the second aspect thereof, achieves a superb balance between high adherence and low contact resistance of the first electrode layer when compared with a structure in which there is interposed an additional member across the entire interface of the first semiconductor region and the first electrode layer and a structure in which there is interposed no additional member at all between the first semiconductor region and the first electrode layer. The present invention therefore improves the properties and reliability of the photovoltaic element.

(3) The present invention, in a third aspect thereof, provides a photovoltaic element including: a semiconductor substrate; a first semiconductor region including a first-conductivity-type semiconductor film on one of surfaces of the semiconductor substrate; a first electrode layer on the first semiconductor region; a second semiconductor region including a second-conductivity-type semiconductor film on a light-receiving face that is another one of the surfaces of the semiconductor substrate; a second electrode layer on the second semiconductor region; and a first conductive film interposed between the first semiconductor region and the first electrode layer, wherein the first electrode layer is extended along a surface of the first conductive film until the first electrode layer reaches the first semiconductor region. The present invention, in the third aspect thereof, achieves a superb balance between high adherence and low contact resistance of the first electrode layer when compared with a structure in which there is interposed an additional member across the entire interface of the first semiconductor region and the first electrode layer and a structure in which there is interposed no additional member at all between the first semiconductor region and the first electrode layer. The present invention therefore improves the properties and reliability of the photovoltaic element.

(4) In any one of the first to third aspects of the present invention, the first conductive film is preferably in direct contact with the first semiconductor region, forming a contact area that is smaller than or equal to a contact area where the first electrode layer is in direct contact with the first semiconductor region. This structure maintains sufficient adherence and further lowers the contact resistance. It will also be appreciated that in the second and third aspects, if there is provided a second conductive film between the second semiconductor region and the second electrode layer, the second conductive film is preferably in direct contact with the second semiconductor region, forming a contact area that is smaller than or equal to a contact area where the second electrode layer is in direct contact with the second semiconductor region.

(5) In any one of the first to third aspects of the present invention, the first conductive film preferably has a thickness that is smaller than or equal to half that of the first electrode layer. This structure further lowers the contact resistance while sufficiently maintaining the adherence. It will also be appreciated that in the second and third aspects, if there is provided a second conductive film between the second semiconductor region and the second electrode layer, the second conductive film preferably has a thickness that is smaller than or equal to half that of the second electrode layer.

(6) In any one of the first to third aspects of the present invention, the first conductive film is preferably covered with the first electrode layer. In this structure, the first electrode layer is formed on the surface of the first semiconductor region so as to cover and surround the first conductive film. The structure therefore further increases adherence between the first conductive film and the first electrode layer over, for example, a structure in which the first conductive film is partially exposed. It will also be appreciated that in the second and third aspects, if there is provided a second conductive film between the second semiconductor region and the second electrode layer, the second conductive film is preferably covered with the second electrode layer.

(7) In any one of the first to third aspects of the present invention, the first conductive film preferably includes a metal oxide film. This structure achieves the effects described above in an enhanced manner. It will also be appreciated that in the second and third aspects, if there is provided a second conductive film between the second semiconductor region and the second electrode layer, the second conductive film preferably includes a metal oxide film.

(8) In any one of the first to third aspects of the present invention, the first conductive film preferably has a lower sheet resistance than does the first semiconductor region. This structure further lowers the contact resistance. It will also be appreciated that in the second and third aspects, if there is provided a second conductive film between the second semiconductor region and the second electrode layer, the same holds true.

(9) In the first or second aspect of the present invention, the photovoltaic element further preferably includes a second conductive film interposed between the second semiconductor region and the second electrode layer, wherein the second electrode layer is extended along a surface of the second conductive film until the second electrode layer reaches the second semiconductor region. This structure further achieves superb balance between high adherence and low contact resistance of the second electrode layer. The structure therefore further improves the properties and reliability of the photovoltaic element.

The invention being thus described, it wilt be obvious that the same may be varied in many ways. Such variations are not to be regarded as a departure from the spirit and scope of the invention, and all such modifications as would be obvious to one skilled in the art are intended to be included within the scope of the following claims.

The aforementioned embodiments and examples are for illustrative purposes only in every respect and should not be subjected to any restrictive interpretations. The scope of the present invention is defined only by the claims and never bound by the specification. Those modifications and variations that may lead to equivalents of claimed elements are all included within the scope of the invention.

INDUSTRIAL APPLICABILITY

The present invention is applicable to photovoltaic elements and methods of manufacturing photovoltaic elements and especially suitably applicable to heterojunction back-contact cells and like solar cells and method of manufacturing these solar cells.

REFERENCE SIGNS LIST 1, 21, 31 Semiconductor Substrate
2, 32 First I-type Semiconductor Film
3, 33 First-conductivity-type Semiconductor Film
4, 34 Second i-type Semiconductor Film
5 First Second-conductivity-type Semiconductor Film
6 Third I-type Semiconductor Film
7 Second Second-conductivity-type Semiconductor Film
8, 28, 36 Antireflective Film
9, 25, 37 First Electrode Layer
10, 26, 38 Second Electrode Layer
11, 39 Conductive Film
11a, 29a, 39a First Conductive Film
11b, 29b Second Conductive Film
12, 13, 14, 15 Etching Mask
16, 74 Electrode Layer
51, 52 Laminate
22 First-conductivity-type Impurity Diffusion Region
23 Second-conductivity-type Impurity Diffusion Region
24 Passivation Film
27 Texture Structure
35 Second-conductivity-type Semiconductor Film
60, 61, 64 Diffusion-preventive Masking Layer
62, 65 Laser Light
63, 66, 67, 68 Opening
70, 71, 73 Metal Mask

The invention claimed is:
1. A photovoltaic element comprising:
a semiconductor substrate;
a first i-type semiconductor film on a part of a surface of the semiconductor substrate;
a first semiconductor region comprising a first-conductivity-type semiconductor film on the first i-type semiconductor film;
a first electrode layer on the first semiconductor region;
a second i-type semiconductor film on another part of the surface of the semiconductor substrate;
a second semiconductor region comprising a second-conductivity-type semiconductor film on the second i-type semiconductor film;
a second electrode layer on the second semiconductor region; and
a first conductive film interposed at least at a site between the first semiconductor region and the first electrode layer, the first conductive film comprising mutually isolated conductive films wherein the first electrode layer is in direct contact with the first semiconductor region, forming a contact area that is greater than a contact area where the first conductive film is in direct contact with the first semiconductor region.
2. The photovoltaic element according to claim 1, wherein the first conductive film has a thickness that is smaller than or equal to half that of the first electrode layer.

3. The photovoltaic element according to claim 1, wherein the first conductive film is covered with the first electrode layer.

4. The photovoltaic element according to claim 1, wherein the first conductive film comprises a metal oxide film.

5. The photovoltaic element according to claim 1, wherein the first conductive film has a lower sheet resistance than does the first semiconductor region.

6. The photovoltaic element according to claim 1, further comprising a second conductive film interposed at least at a site between the second semiconductor region and the second electrode layer.

* * * * *